(12) United States Patent
Anderson et al.

(10) Patent No.: US 8,884,639 B2
(45) Date of Patent: Nov. 11, 2014

(54) METHODS, APPARATUS AND ARTICLES OF MANUFACTURE FOR TESTING A PLURALITY OF SINGULATED DIE

(75) Inventors: James C. Anderson, San Jose, CA (US); Alan D. Hart, San Carlos, CA (US); Kenneth D. Karklin, Pasadena, CA (US)

(73) Assignee: Advantest (Singapore) Pte Ltd, Singapore (SG)

( * ) Notice: Subject to any disclaimer, the term of this patent is extended or adjusted under 35 U.S.C. 154(b) by 498 days.

(21) Appl. No.: 12/549,049

(22) Filed: Aug. 27, 2009

(65) Prior Publication Data

US 2010/0109699 A1 May 6, 2010

Related U.S. Application Data

(60) Provisional application No. 61/190,357, filed on Aug. 27, 2008.

(51) Int. Cl.
*G01R 31/20* (2006.01)
*H01L 21/66* (2006.01)
*G01R 31/28* (2006.01)

(52) U.S. Cl.
CPC ............ *H01L 22/20* (2013.01); *G01R 31/2891* (2013.01)
USPC ............ 324/754.09; 324/754.01; 324/754.03; 324/754.08; 324/754.11; 438/14; 438/15

(58) Field of Classification Search
CPC ............ G01R 1/0483; G01R 1/07314; G01R 1/06788; G01R 1/07328; G01R 1/06711; G01R 1/0408; G01R 31/20; G01R 31/26; G01R 31/28; G01R 31/2831; G01R 31/2886; G01R 31/2889; G01R 31/2893; G01R 31/2851; G01R 31/311; G01R 31/2884; G01R 31/318505; G01R 31/2808; H01L 23/52; H01L 23/48; H01L 23/12; H01L 24/16
USPC ............. 324/754.01–754.14, 754.18–754.19, 324/755.14–757.05, 762.01–762.03; 438/14, 15, 117
See application file for complete search history.

(56) References Cited

U.S. PATENT DOCUMENTS

| | | | |
|---|---|---|---|
| 5,279,975 A | | 1/1994 | Devereaux et al. |
| 5,475,317 A | * | 12/1995 | Smith ........................ 324/750.05 |
| 5,654,204 A | | 8/1997 | Anderson |
| 5,985,682 A | * | 11/1999 | Higgins, III .................... 438/10 |
| 6,373,268 B1 | | 4/2002 | Dunlap et al. |

(Continued)

FOREIGN PATENT DOCUMENTS

| | | |
|---|---|---|
| JP | 2004340696 A | 12/2004 |
| WO | WO 2004/001428 | 12/2003 |
| WO | WO 2007/035664 | 3/2007 |

OTHER PUBLICATIONS

International Search Report and Written Opinion mailed Apr. 2, 2010 for application No. PCT/US2009/055165.

*Primary Examiner* — Tung X Nguyen
*Assistant Examiner* — Thang Le

(57) ABSTRACT

In one embodiment, a method for testing a plurality of singulated semiconductor die involves 1) placing each of the singulated semiconductor die on a surface of a die carrier, 2) mating an array of electrical contactors with the plurality of singulated semiconductor die, and then 3) performing electrical tests on the plurality of singulated semiconductor die, via the array of electrical contactors.

18 Claims, 22 Drawing Sheets

(56) References Cited

U.S. PATENT DOCUMENTS

| | | |
|---|---|---|
| 6,406,246 B1 | 6/2002 | Itoh et al. |
| 6,583,635 B2 * | 6/2003 | Hembree et al. .......... 324/756.05 |
| 6,627,483 B2 * | 9/2003 | Ondricek et al. ............. 438/117 |
| 6,720,786 B2 * | 4/2004 | Song et al. ............... 324/754.03 |
| 6,897,670 B2 | 5/2005 | Burns |
| 7,045,035 B1 | 5/2006 | Kelkar et al. |
| 7,699,616 B2 * | 4/2010 | Miller et al. ..................... 439/45 |
| 7,940,070 B2 * | 5/2011 | Chiang ..................... 324/756.02 |
| 8,044,673 B1 * | 10/2011 | Burgyan ................... 324/750.16 |
| 8,102,184 B2 * | 1/2012 | Sherry et al. ............. 324/754.03 |
| 8,496,113 B2 * | 7/2013 | Na et al. ......................... 206/722 |
| 8,513,969 B2 * | 8/2013 | Dozier et al. ............. 324/754.09 |
| 8,550,443 B1 * | 10/2013 | Di Stefano .................... 269/303 |
| 2003/0129775 A1 | 7/2003 | Kline |
| 2005/0225344 A1 * | 10/2005 | Kirby ............................ 324/755 |
| 2006/0145338 A1 * | 7/2006 | Dong ............................ 257/723 |
| 2006/0290367 A1 * | 12/2006 | Hobbs et al. .................. 324/763 |
| 2007/0007987 A1 * | 1/2007 | Farnworth et al. ............. 324/765 |
| 2007/0063721 A1 | 3/2007 | Dozier, II et al. |
| 2007/0216437 A1 * | 9/2007 | Slaughter et al. .............. 324/765 |
| 2007/0269909 A1 * | 11/2007 | Ondricek et al. ............... 438/14 |
| 2008/0233663 A1 | 9/2008 | Norbeck et al. |
| 2008/0252330 A1 | 10/2008 | Hart et al. |
| 2009/0079452 A1 * | 3/2009 | Eldridge et al. ............... 324/758 |
| 2010/0039133 A1 * | 2/2010 | McFarland et al. ............ 324/758 |
| 2010/0244873 A1 * | 9/2010 | Dozier et al. .................. 324/755 |

\* cited by examiner

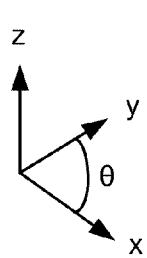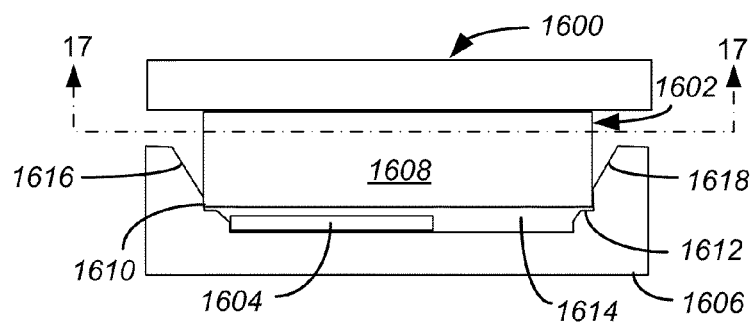
FIG. 16A
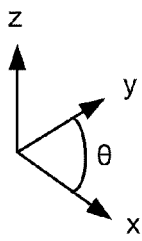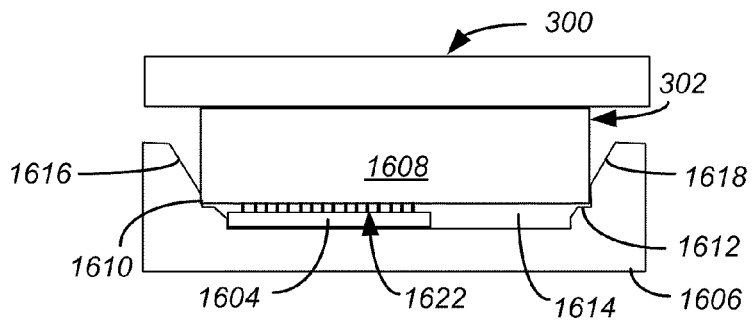
FIG. 16B
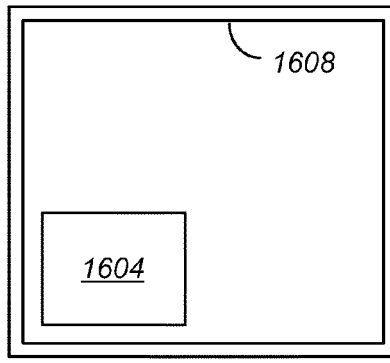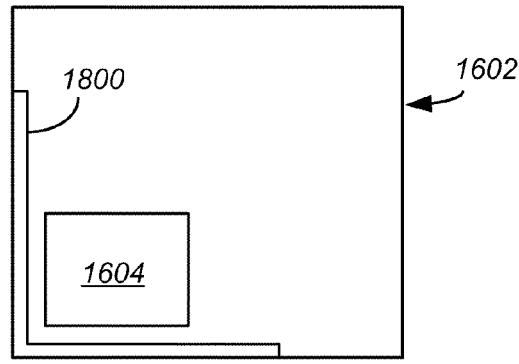
FIG. 17          FIG. 18

METHODS, APPARATUS AND ARTICLES OF MANUFACTURE FOR TESTING A PLURALITY OF SINGULATED DIE

CROSS-REFERENCE TO RELATED APPLICATION

This application claims the benefit of U.S. Provisional Application No. 61/190,357, filed Aug. 27, 2008, which is hereby incorporated by reference for all that it discloses.

BACKGROUND

Currently, semiconductor die are initially tested while part of a wafer. That is, a wafer is placed in a machine known as a wafer prober and an apparatus known as a probe card is brought into contact with some or all of the semiconductor die on the wafer. The probe card has arrays of probes on it that, via an optical measurement and adjustment process, are typically aligned to the complimentary bond or probe pads on the semiconductor die. Since the wafer and probe card are each a monolithic structure, the probe card is typically fixed in place while the wafer is mechanically moved into alignment with the probes on the probe card.

A probe card typically comprises a probe head coupled to a printed circuit board. The probe head carries the probes that actually touch down on a wafer. The printed circuit board facilitates connecting the electrical contacts of the probe head to a place of access by external automated test equipment (ATE).

SUMMARY

In one embodiment, a method of mating an array of electrical contactors with a plurality of singulated semiconductor die comprises: 1) placing the plurality of singulated semiconductor die on a plurality of die sub-carriers, and 2) mating the plurality of singulated semiconductor die with the array of electrical contactors. Each die sub-carrier is supported by a die carrier, and each die sub-carrier is independently moveable with respect to the die carrier. The plurality of die sub-carriers may have a plurality of registration features thereon, and the array of electrical contactors may have a second plurality of registration features. The second plurality of registration features corresponds to the first plurality of registration features. The mating of the plurality of singulated semiconductor die with the array of electrical contactors causes corresponding ones of the first and second pluralities of registration features to register with one another and move at least one of the die sub-carriers with respect to the die carrier. In some embodiments, causing movement of at least one of the die sub-carriers may comprise causing movement in an elastomeric element positioned between one of the die sub-carriers and the die carrier. In other embodiments; causing movement of at least one of the die sub-carriers may comprise causing movement of a spring that attaches one of the die sub-carriers to the die carrier.

In another embodiment, apparatus for testing a plurality of singulated semiconductor die comprises a multi-level die carrier and an array of electrical contactors. The multi-level die carrier has a plurality of die sub-carriers that are moveably attached to a die carrier, wherein each die sub-carrier is independently moveable with respect to the die carrier, and wherein each die sub-carrier is configured to hold one or more of the singulated semiconductor die. The array of electrical contactors configured to contact the singulated semiconductor die carried on the multi-level die carrier.

In some embodiments, the multi-level die carrier may comprise at least one elastomeric element that is positioned between at least one of the die sub-carriers and the die carrier. In other embodiments, the multi-level die carrier may comprise a plurality of motors or actuators positioned between the die sub-carriers and the die carrier, wherein the motors or actuators are configured to move the die sub-carriers with respect to the die carrier.

In still other embodiments, the multi-level die carrier may have a first plurality of registration features thereon, and the array of electrical contactors may have a second plurality of registration features, wherein the second plurality of registration features correspond to the first plurality of registration features. In some embodiments, some of the registration features may be MEMS features; and in some embodiments, the registration features may be walls of cavities for holding the plurality of singulated semiconductor die.

In yet another embodiment, a method of mating an array of electrical contactors with a plurality of singulated semiconductor die comprises: 1) placing the plurality of singulated semiconductor die on a die carrier, said die carrier having a plurality of registration features thereon, and 2) mating the plurality of singulated semiconductor die with the array of electrical contactors. The array of electrical contactors has a second plurality of registration features, wherein the second plurality of registration features correspond to the first plurality of registration features. The electrical contactors are attached to a base substrate individually or in multiple groups. The attachments provide independent movement of the individual electrical contactors or electrical contactor groups with respect to the base substrate. The mating of the plurality of singulated semiconductor die with the array of electrical contactors causes corresponding ones of the first and second pluralities of registration features to register with one another and move at least one of the individual electrical contactors or electrical contactor groups with respect to the base substrate. In some embodiments, causing movement of at least one of the individual electrical contactors or electrical contactor groups may comprise causing movement in an elastomeric interposer positioned between one of the individual electrical contactors or electrical contactor groups and the base substrate. In other embodiments, causing movement of at least one of the individual electrical contactors or electrical contactor groups may comprise causing movement of a spring that attaches one of the individual electrical contactors or electrical contactor groups to the base substrate.

In still another embodiment, apparatus for testing a plurality of singulated semiconductor die comprises 1) a die carrier configured to hold one or more of the singulated semiconductor die; 2) a base substrate; and 3) an array of electrical contactors for contacting the singulated semiconductor die carried on the die carrier. The electrical contactors may be attached to the base substrate individually or in multiple groups. The attachments provide independent electronically-controlled or kinematically-controlled movement of the individual electrical contactors or electrical contactor groups with respect to the base substrate. In some embodiments, at least one elastomeric interposer may be positioned between i) at least one of the individual electrical contactors or electrical contactor groups, and ii) the base substrate. In other embodiments, the apparatus may comprise a plurality of motors or actuators that are positioned between i) ones of the individual electrical contactors or electrical contactor groups, and ii) the base substrate. The motors or actuators may be configured to move the individual electrical contactors or electrical contactor groups with respect to the base substrate.

The die carrier may have a first plurality of registration features thereon, and the array of electrical contactors may have a second plurality of registration features, wherein the second plurality of registration features corresponds to the first plurality of registration features. In some embodiments, some of the registration features may be MEMS features; and in some embodiments, the registration features may be walls of cavities for holding the plurality of singulated semiconductor die. In some cases, the cavities may be formed in die sub-carriers carried by a die carrier.

In another embodiment, a method of mating an array of electrical contactors with a plurality of singulated semiconductor die comprises: 1) placing the plurality of singulated semiconductor die on a die carrier; 2) aligning the singulated semiconductor die placed on the die carrier with the array of electrical contactors; and 3) moving the die carrier and the array of electrical contactors toward one another. The singulated semiconductor die may be aligned with the array of electrical contactors by: a) using one or more cameras to acquire images of features on the die carrier and array of electrical contactors; b) comparing the acquired images to desired images to determine how at least one of the die carrier and the array of electrical contactors should be moved; and c) moving at least one of the die carrier and the array of electrical contactors in response to the comparing. In some embodiments, the die carrier may be heated before the singulated semiconductor die placed on the die carrier are aligned with the array of electrical contactors. In some cases, the features on the die carrier may be features on the singulated semiconductor die themselves.

In a further embodiment, a method of aligning a plurality of singulated semiconductor die on a die carrier comprises: 1) placing the plurality of singulated semiconductor die on the die carrier; 2) using one or more capacitive probes to determine positions of the singulated semiconductor die on the die carrier, and then constructing a map of the singulated semiconductor die on the die carrier; 3) comparing positions of the singulated semiconductor die in the map to desired positions; and 4) moving at least one singulated semiconductor die on the die carrier to one of the desired positions.

In yet another embodiment, a method of mapping a plurality of singulated semiconductor die on a die carrier comprises: 1) placing the plurality of singulated semiconductor die on the die carrier; and 2) using one or more capacitive probes to determine positions of the singulated semiconductor die on the die carrier, and constructing a map of the singulated semiconductor die on the die carrier.

In a still further embodiment, a method for testing a plurality of singulated semiconductor die comprises: 1) placing each of the singulated semiconductor die on a surface of a die carrier, and registering each of the singulated semiconductor die with at least one of a plurality of features on the surface of the die carrier; 2) mating an array of electrical contactors with the plurality of singulated semiconductor die; and then 3) performing electrical tests on the plurality of singulated semiconductor die, via the array of electrical contactors. In some cases, placing each of the singulated semiconductor die on the surface of the die carrier may comprise placing each of the singulated semiconductor die in one of a plurality of cavities on the surface of the die carrier, where each of the plurality of cavities has x and y dimensions that are larger than x and y dimensions of any singulated semiconductor die placed therein. In these cases, registering each of the singulated semiconductor die with at least one of the plurality of features on the surface of the die carrier may comprise registering each of the singulated semiconductor die with at least one cavity wall of one of the cavities. Registering each of the singulated semiconductor dies with one of the cavity walls may comprise using at least one of: a mechanical push, a vacuum pull, micro-fluidics, positive pressure push, gravity, and vibration.

In some cases, registering each of the semiconductor dies with one of the cavity walls may comprise registering at least one group of four singulated semiconductor die to adjacent cavity walls, thereby forming at least one cluster of die. In other cases, placing each of the singulated semiconductor die on the surface of the die carrier may comprise placing multiple singulated semiconductor die in each of a plurality of cavities on the surface of the die carrier.

Registering each of the singulated semiconductor die with at least one of a plurality of features on the surface of the die carrier may comprise registering each of the semiconductor dies with a MEMS feature on the surface of the die carrier.

Placing each of the semiconductor die on the surface of the die carrier may comprise 1) placing one or more of the semiconductor die on each of a plurality of die sub-carriers, and 2) placing the die sub-carriers on the surface of the die carrier.

In some cases, singulated semiconductor die may be adhered to the surface of a die carrier by pulling a vacuum through corresponding holes in the die carrier and die sub-carriers. In some cases, the vacuum may be pulled through corresponding holes in at least one elastomeric element that is positioned between the die carrier and at least one of the die sub-carriers.

In some embodiments, mating electrical contactors with each of the semiconductor die in a plurality of singulated semiconductor die may comprise mating corresponding kinematic features on the die carrier and the array of electrical contactors. In other embodiments, mating electrical contactors with each of the semiconductor die in the plurality of singulated semiconductor die may comprise mating i) MEMS features on the die carrier or the electrical contactors, with ii) mechanical features on the other of the die carrier or the electrical contactors.

Prior to mating electrical contactors with each of the semiconductor die in the plurality of singulated semiconductor die, at least one camera may be used to acquire images of features on at least one of the die carrier and the electrical contactors. At least one of the die carrier or the electrical contactors may then be moved in response to a comparison of i) the acquired images of the features with ii) desired images of the features.

In another embodiment, a method of preparing a plurality of singulated semiconductor die for test comprises: 1) placing a plurality of die sub-carriers on a die carrier; 2) placing at least one of the plurality of singulated semiconductor die on each of the die sub-carriers; and 3) registering the singulated semiconductor die with features on the surfaces of the die sub-carriers.

In another embodiment, apparatus comprises a plurality of die sub-carriers for holding a plurality of singulated semiconductor die; and a die carrier having i) a surface for holding the plurality of die sub-carriers, ii) a cavity beneath the surface, having a plurality of holes therein corresponding to locations of the die sub-carriers, and iii) a port, coupled to the cavity, for creating a vacuum to adhere the plurality of die sub-carriers to the surface of the die carrier. In some cases, at least one elastomeric element may be positioned between the plurality of die sub-carriers and the die carrier, with the at least one elastomeric element having a plurality of holes therein for creating the vacuum that adheres the plurality of die sub-carriers to the surface of the die carrier.

In a still further embodiment, an article of manufacture for holding singulated semiconductor die comprises a surface having a plurality of die-holding cavities therein, each cavity having a sloped cavity wall, and each cavity having x and y dimensions that are larger than x and y dimensions of a singulated semiconductor die to be placed therein. In some embodiments, each of the cavities may have a die-holding surface that intersects the sloped wall of the cavity. In other embodiments, each of the cavities may have a vertical cavity wall that intersects a die-holding surface of the cavity, wherein the sloped cavity walls intersect said vertical cavity walls. In other embodiments, the cavity walls may have shelves machined therein, where each shelf provides a z-stop for apparatus that interfaces with the cavities.

BRIEF DESCRIPTION OF THE DRAWINGS

Illustrative embodiments of the invention are illustrated in the drawings, in which:

FIGS. 16A & 17 illustrate an exemplary pick-and-place system;

FIG. 16B illustrates an electrical contactor that may be registered with a die carrier similarly to how the pick-and-place head shown in FIG. 16A is registered with a die carrier;

FIG. 18 illustrates an alternate configuration of registration features for a pick-and-place head or electrical contactor (as compared to what is shown in FIGS. 16A, 16B & 17);

DETAILED DESCRIPTION

Figure 1:
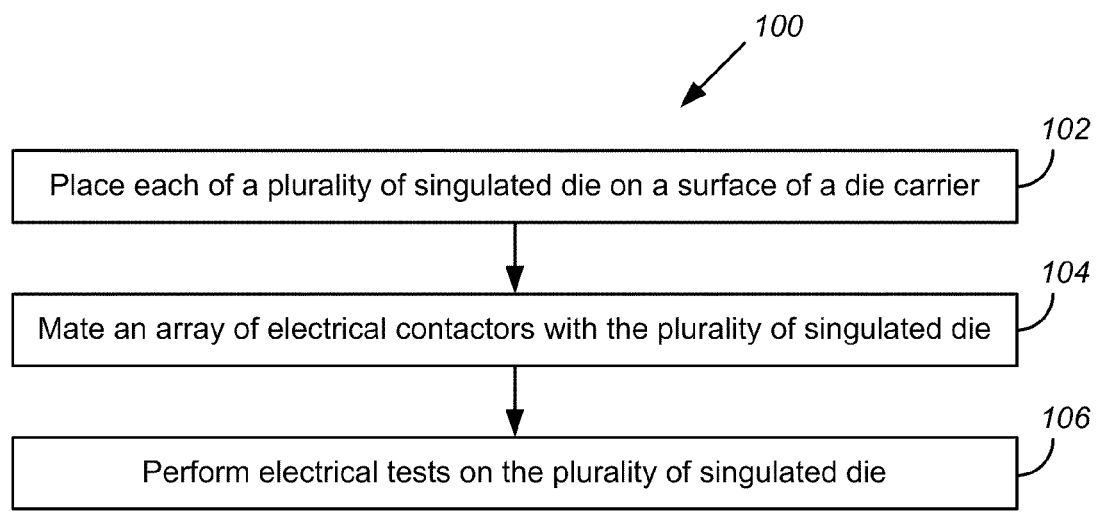
FIG. 1 illustrates an exemplary method for testing a plurality of singulated die.

As used herein, a "singulated semiconductor die" is a semiconductor die that has been sawed, cut or otherwise separated from the semiconductor wafer on which it was formed. In some cases, the semiconductor wafer material on which a semiconductor die is formed may be thinned. Thinning typically occurs before semiconductor die are separated from their wafer, though thinning could alternately be done after separation. Regardless, the phrase "singulated semiconductor die" is intended to cover both thinned and non-thinned semiconductor die. Singulated semiconductor die are sometimes referred to herein as "singulated die" or simply "die".

U.S. Pat. No. 5,654,204 and U.S. patent application Ser. No. 11/735,871, both of which are hereby incorporated by reference, disclose various methods and apparatus for testing singulated die. The motivations for Singulated Die Test (SDT) are many, and some of these motivations are disclosed below. Some of the below motivations have been noted in the past, and some have not. Many of the motivations noted below relate to improvements in the quality and quantity of tests that can be performed on a semiconductor die prior to its being packaged.

Currently, manufacturers are stacking multiple semiconductor die to create three dimensional semiconductor products. This includes stacking different memory types and stacking memories with digital logic. If one of the die in a stack is bad, the entire stack will often need to be discarded, thereby multiplying the cost of a single bad die by two, four or more. SDT enables test of a die just before it is stacked or packaged, thereby enabling the identification of bad die prior to incurring the extra costs related to stacking or packaging die, and reducing the likelihood that a stack of die or package will need to be discarded.

In traditional wafer test, the temperature at which semiconductor die may be tested is limited to a range of about 80-90° C. SDT allows one to test singulated die at their maximum operating temperatures, enabling the identification of die that only fail at extreme temperatures, and again mitigating the likelihood that a stack of die or package will need to be discarded.

When stacking die, the die are typically "thinned" (i.e., ground on their back side) to a smaller thickness before being assembled into a stack. Because thinning a semiconductor wafer makes the wafer non-planar and incompatible with traditional whole wafer testing methods, wafers are thinned after wafer testing is complete. However, the act of thinning a wafer can cause additional defects in semiconductor devices. SDT enables the test of singulated die after they have been thinned, thereby enabling the identification of die that have been damaged as a result of wafer thinning.

When testing die in whole wafer form, electronic test equipment must be routed from a physically distant point (many centimeters to meters away), through the probe card printed circuit board, through the probe head, and ultimately to the die under test. This separation distance reduces the quality of signal transmission paths and ultimately reduces the quality of test. By singulating die prior to test, the die may be placed in closer proximity to the testing electronics, resulting in higher quality test.

Most probe cards are only able to test a subset of the die on a wafer, and the function of a wafer prober is to step (move) an untested part of the wafer into position under a probe head. However, the probe card technology for some types of semiconductors (such as memory wafers) has advanced to a point that the probe head may contain enough probes to contact all of the die on a wafer at once. When a single touch down on all of a wafer's die is achieved, further parallelism cannot be achieved using conventional test equipment. SDT changes this and removes a large impediment to greater parallelism in test.

Finally, a competing limitation between probe heads and semiconductor die relates to how tightly the probe pads on semiconductor die can be packed while still allowing a probe head to provide probe tips that are just as tightly packed. When singulating die prior to test, there are no neighboring die to contend with, and many of the packing limitations of the probe head can be overcome. That is, singulated die may be spaced apart from one another during test.

Given the above motivations for SDT, FIG. 1 illustrates an exemplary method 100 for testing a plurality of singulated die. The method 100 comprises 1) placing each of the singulated die on a surface of a die carrier (at block 102), 2) mating an array of electrical contactors with the plurality of singulated die (at block 104), and then 3) performing electrical tests on the plurality of singulated die, via the array of electrical contactors (at block 106). Preferably, the electrical tests are performed on all of the singulated die in parallel. As used herein, an "array of electrical contactors" is intended to cover any sort of interface that can be used to contact (or probe) the electrical contacts (e.g., bond pads) of a plurality of singulated die.

Figure 2:
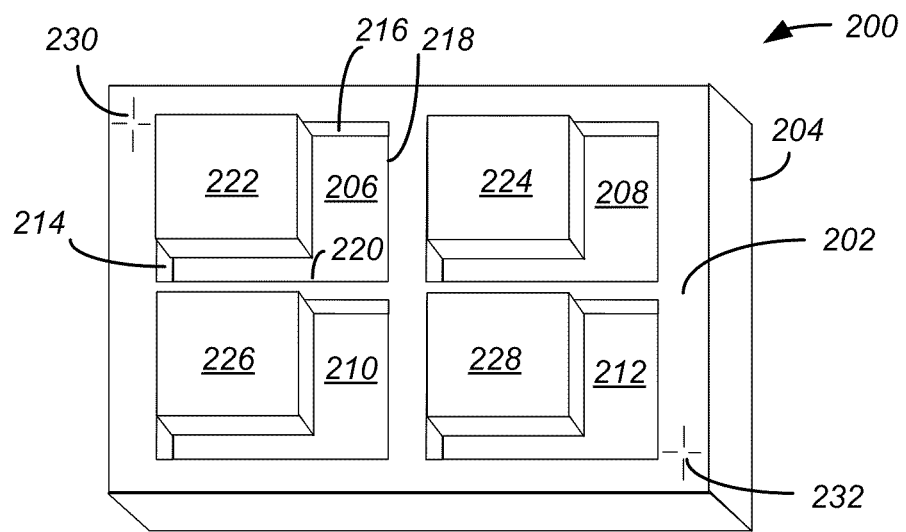
FIG. 2 illustrates an exemplary die carrier for use with the method shown in FIG. 1 (or other methods)

FIG. 2 illustrates an exemplary die carrier 200 for use with the method 100 (or other methods). The die carrier 200 comprises at least first and second opposed surfaces 202, 204, such as a top surface 202 and a bottom surface 204. One of the surfaces has a plurality of cavities (e.g., milled or other types of cavities 206, 208, 210, 212) formed therein, with each of the cavities 206, 208, 210, 212 having one or more cavity walls 214, 216, 218, 220. By way of example, each cavity 206, 208, 210, 212 is shown to have a rectangular shape and four cavity walls 214, 216, 218, 220. Although each cavity 206, 208, 210, 212 may be sized just larger than the dimensions of a particular singulated die 222, 224, 226, 228, each cavity 206, 208, 210, 212 preferably has x and y dimensions that are larger than the x and y dimensions of any singulated die that might be placed therein. This not only enables easier placement of a die 222 within a cavity 206, but it also enables the die carrier 200 to be used with dies of different size.

Figure 3:
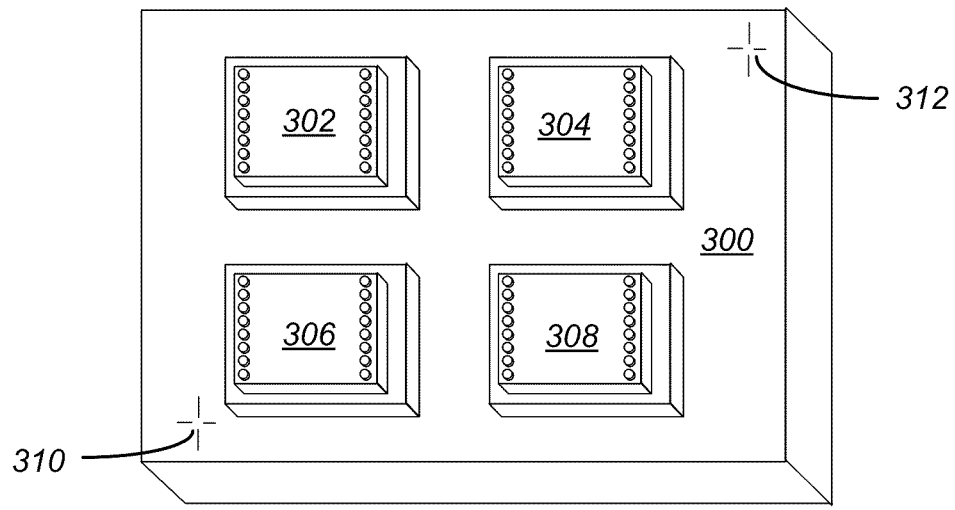
FIG. 3 illustrates an exemplary set of separate electrical contactors for mating with the arrangement of die shown in FIG. 2.
Figure 5:
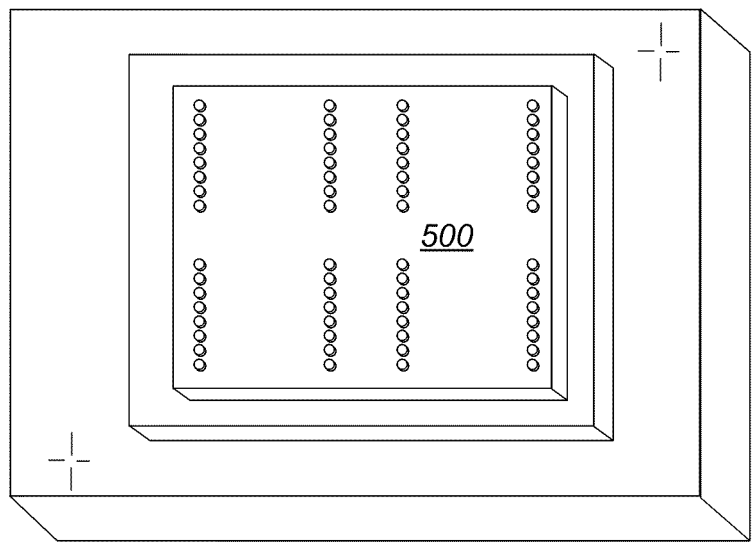
FIG. 5 illustrates an exemplary contactor for mating with the arrangement of die shown in FIG. 4.
Figure 4:
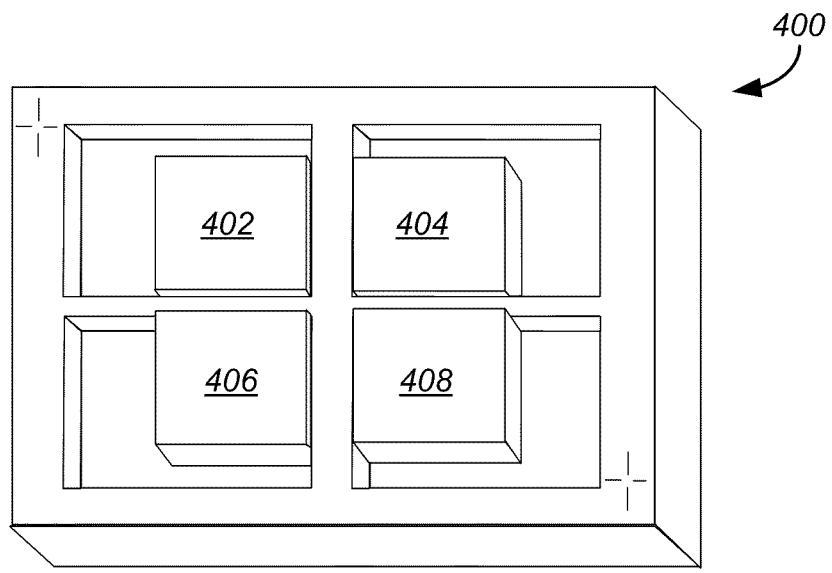
FIG. 4 illustrates the exemplary die carrier shown in FIG. 2, wherein die are placed on the die carrier in a cluster.

To accomplish the "placing" step 102 of the method 100 (FIG. 1), singulated die 222, 224, 226, 228 (FIG. 2) are placed in some or all of the cavities 206, 208, 210, 212 of the die carrier 200. In some cases, and as discussed later in this description, it is not necessary to align (or at least precisely align) the die 222, 224, 226, 228 within their cavities 206, 208, 210, 212. However, as shown, placing the singulated die 222, 224, 226, 228 on the die carrier 200 may further comprise registering each of the singulated die 222 with one or more cavity walls 214, 216, such as cavity walls oriented in x and y dimensions. FIG. 2 illustrates a scenario where each singulated die 222, 224, 226, 228 is positioned in its respective cavity 206, 208, 210, 212 in the same way (e.g., registered to upper left cavity walls 214, 216 when looking at the figure). FIG. 4 illustrates an alternative die carrier 400, where four singulated die 402, 404, 406, 408 are registered to adjacent cavity walls, such that the four singulated die 402, 404, 406, 408 form a cluster of die. As will become clear later in this description, the die arrangement shown in FIG. 2 might be useful where uniformity is desired, or where it is desired to mate a separate electrical contactor with each semiconductor die 222, 224, 226, 228. An exemplary set of separate electrical contactors 302, 304, 306, 308, mounted in an array on a common substrate 300, for mating with the arrangement of die shown in FIG. 2, is shown in FIG. 3. The die arrangement shown in FIG. 4 might be useful where it is desired to reduce the size of a single electrical contactor that mates with a set of four die. An exemplary electrical contactor 500 for mating with the arrangement of die shown in FIG. 4 is shown in FIG. 5.

Figure 6:
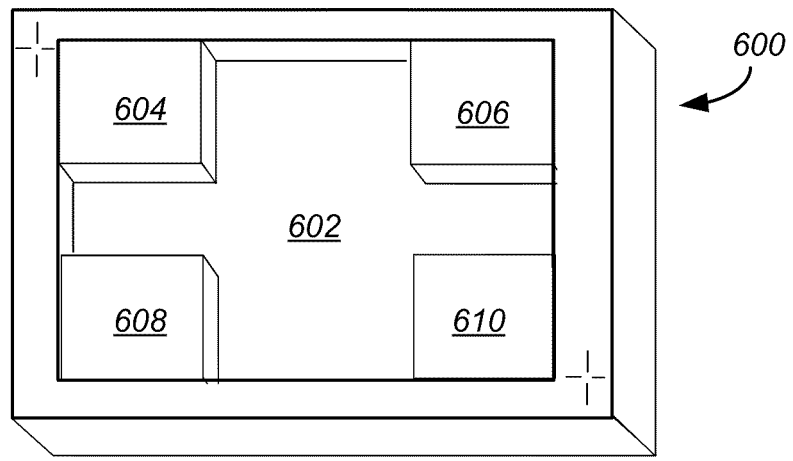
FIG. 6 illustrates an alternate way to register die with a cavity of a die carrier.

FIG. 6 illustrates yet another alternative die carrier 600. The die carrier 600 provides a single cavity 602, with the single cavity 602 being large enough that different singulated die 604, 606, 608, 610 can be registered with the intersecting walls at each of the cavity's corners.

By way of example, each of the die carriers 200, 400, 600 shown in FIGS. 2, 4 & 6 is shown to carry four singulated die (such as the die 222, 224, 226, 228 shown in FIG. 2). However, the cavity arrangements of the various die carriers 200, 400, 600 can be replicated so that a single die carrier is capable of holding as many die as desired. For example, a single die carrier could hold a 2×2 array of die, a 3×3 array of die, a 250×500 array of die, or any other sized array of die.

Also by way of example, each of FIGS. 2, 4 & 6 illustrates a die carrier 200, 400, 600 with rectangular die-holding cavities. However, the cavities need not be rectangular and could alternately be circular or have other shapes. The cavities could also be formed of intersecting shapes, such as 1) rectangles intersected by small circles at the corners thereof, or 2) intersecting circles.

Figure 7:
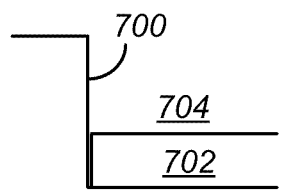
FIGS. 7-9 illustrate elevations of different cavity wall profiles.
Figure 8:
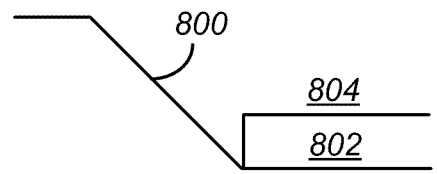
Figure 9:
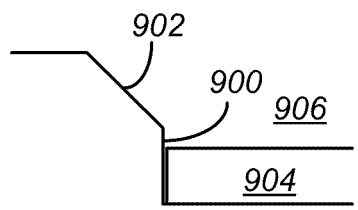

FIGS. 7-9 illustrate elevations of different cavity wall profiles 700, 800, 900/902. FIG. 7 illustrates a vertical cavity wall 700. FIG. 8 illustrates a sloped cavity wall 800. FIG. 9 illustrates a vertical cavity wall 900 bounded by a bevel (or slope 902). The cavity walls 800, 900/902 shown in FIGS. 8 & 9 help to correct any misplacement of a singulated die 802, 904 dropped in a cavity 804, 906, while the cavity walls 700, 900/902 shown in FIGS. 7 & 9 provide a better-defined wall for registering a die 702, 904. Other cavity wall profiles, are also possible.

Singulated die may be placed on a die carrier using a pick-and-place system, such as a system that picks up die using a vacuum, positions the die over their desired locations, and then places the die in their desired locations. If the pick-and-place system is "accurate enough", no further movement of the die may be necessary. However, in those cases where the pick-and-place system is not "accurate enough", the registration of a die with a cavity wall may need to be accomplished by moving the die. In some cases, moving a die on a die carrier may include using at least one of: a mechanical push, a vacuum pull, micro-fluidics, a positive pressure push, gravity, or vibration.

Figure 10:
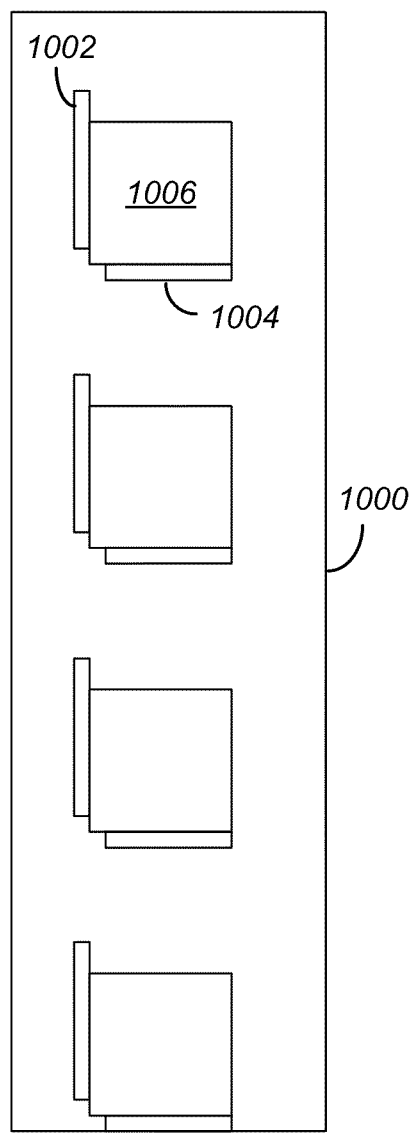
FIGS. 10 & 11 illustrate plan views of exemplary die carriers that employ MEMS features for the registration of die.
Figure 11:
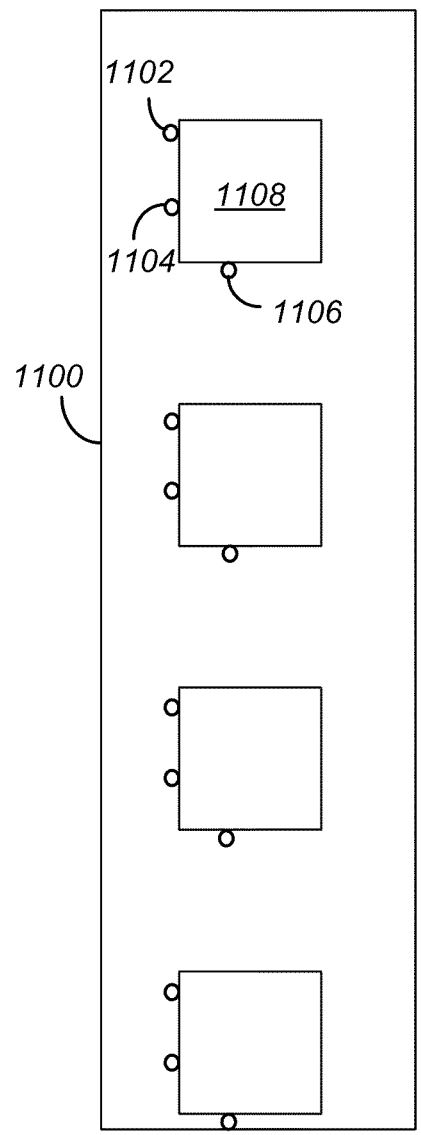

FIGS. 10 & 11 illustrate plan views of exemplary die carriers 1000, 1100 that employ MEMS features 1002, 1004, 1102, 1104, 1106 for the registration of die 1006, 1108. By way of example, the die carrier 1000 shown in FIG. 10 has a plurality of MEMS walls 1002, 1004 formed thereon. The walls 1002, 1004 are paired to provide L-shaped registration mechanisms, against which die 1006 may be registered. Alternately, the MEMS features could comprise posts 1102, 1104, 1106 (FIG. 11) or other MEMS features. As part of the "placing" step 102 of the method 100 (FIG. 1), semiconductor die 1006, 1108 may be registered with the MEMS features 1002, 1004, 1102, 1104, 1106. Die that need to be moved on the surface of one of the die carriers 1000, 1100, e.g. for registration purposes, can be moved similarly to how dies are moved within a die carrier cavity 206 (FIG. 2).

Figure 12:
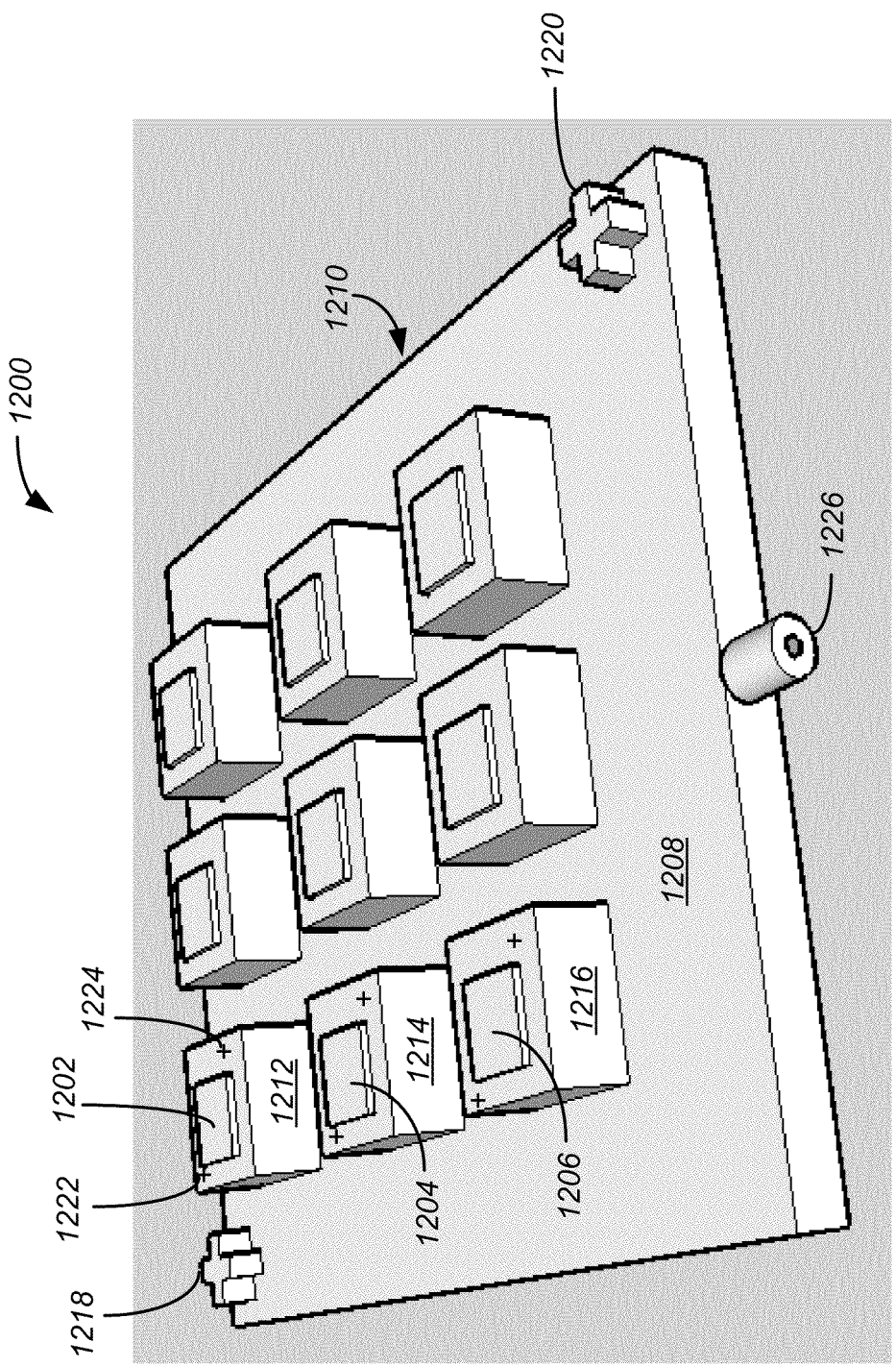
FIGS. 12-14 illustrate exemplary embodiments of multi-level die carriers.
Figure 13:
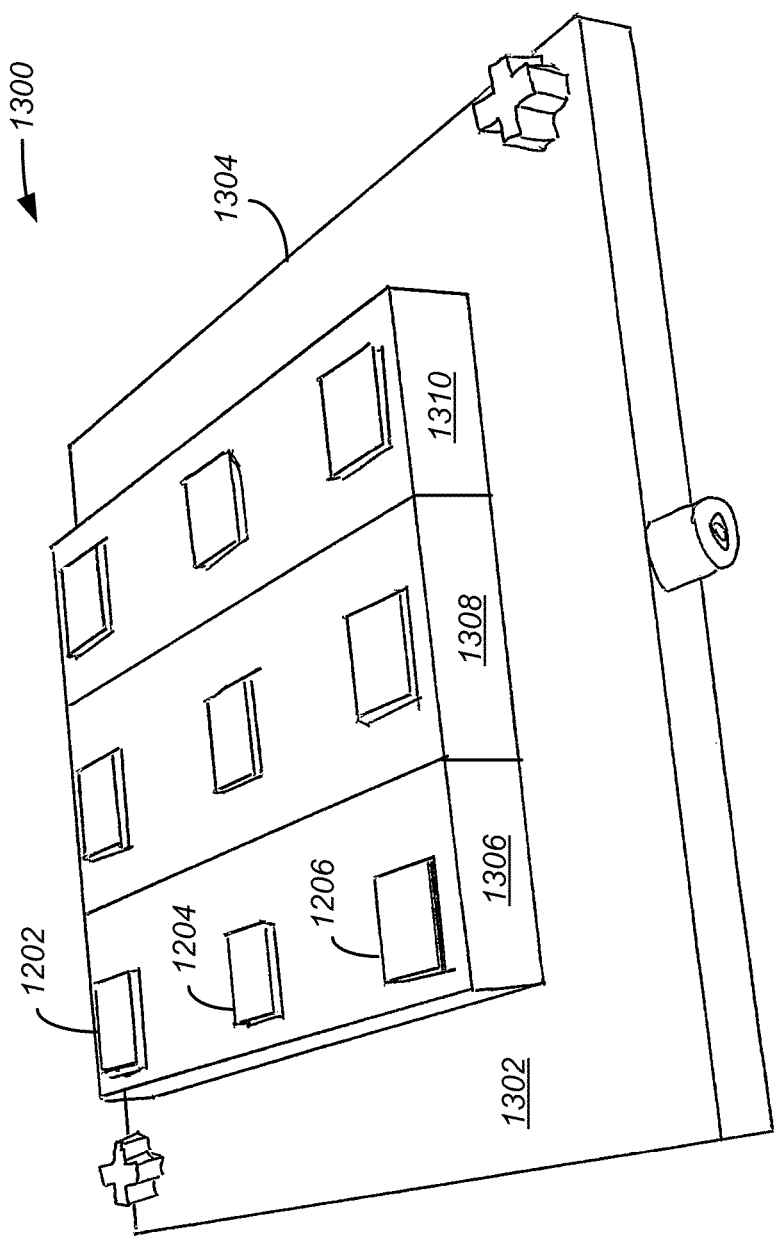
Figure 14:
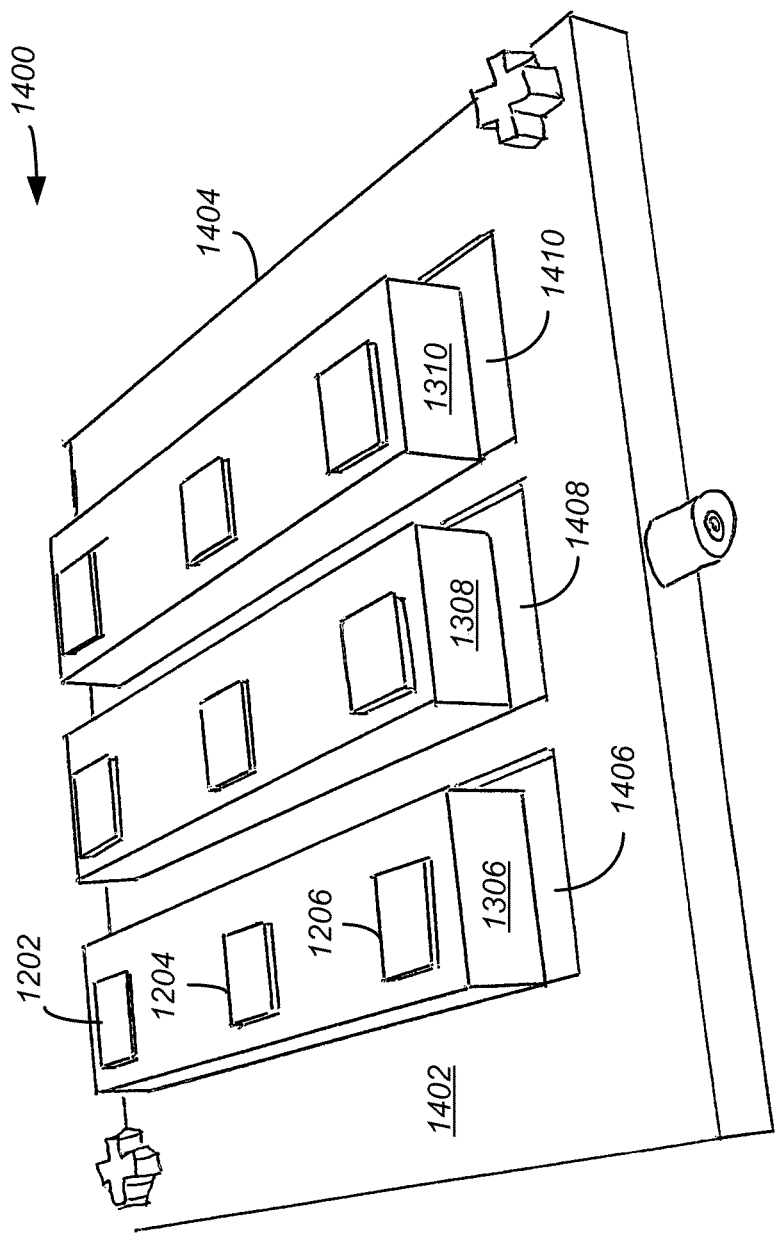

FIGS. 12-14 illustrate exemplary embodiments of multi-level die carriers 1200, 1300, 1400, where singulated die 1202, 1204, 1206 are placed on a surface 1208, 1302 or 1402 of a die carrier 1210, 1304 or 1404 by 1) placing one (FIG. 12) or more (FIGS. 13 & 14) singulated die 1202, 1204, 1206 on each of a plurality of die sub-carriers 1212, 1214, 1216 or 1306, 1308, 1310, and 2) placing the die sub-carriers 1212, 1214, 1216 or 1306, 1308, 1310 on the surface 1208, 1302 or 1402 of the die carrier 1210, 1304 or 1404. In this manner, a sort of modular die carrier 1200, 1300 or 1400 can be constructed. The die sub-carriers 1212, 1214, 1216 may be placed on a die carrier 1200 with separation between the die sub-carriers (see FIG. 12) or with the die sub-carriers 1306, 1308, 1310 abutted to one another (see FIG. 13). Alternately, a die carrier 1404 may be provided with a plurality of cavities 1406, 1408, 1410, and the die sub-carriers 1306, 1308, 1310 may be registered to walls of the cavities 1406, 1408, 1410 (see FIG. 14). In other arrangements, the die sub-carriers could be registered with MEMS features of a die carrier.

In some embodiments, the die sub-carriers 1212, 1214, 1216, 1306, 1308, 1310 shown in FIGS. 12-14 may be formed similarly to the die carriers 200, 400, 600, 1000, 1100 shown in any of FIGS. 2, 4, 6, 10 and 11.

Figure 15:
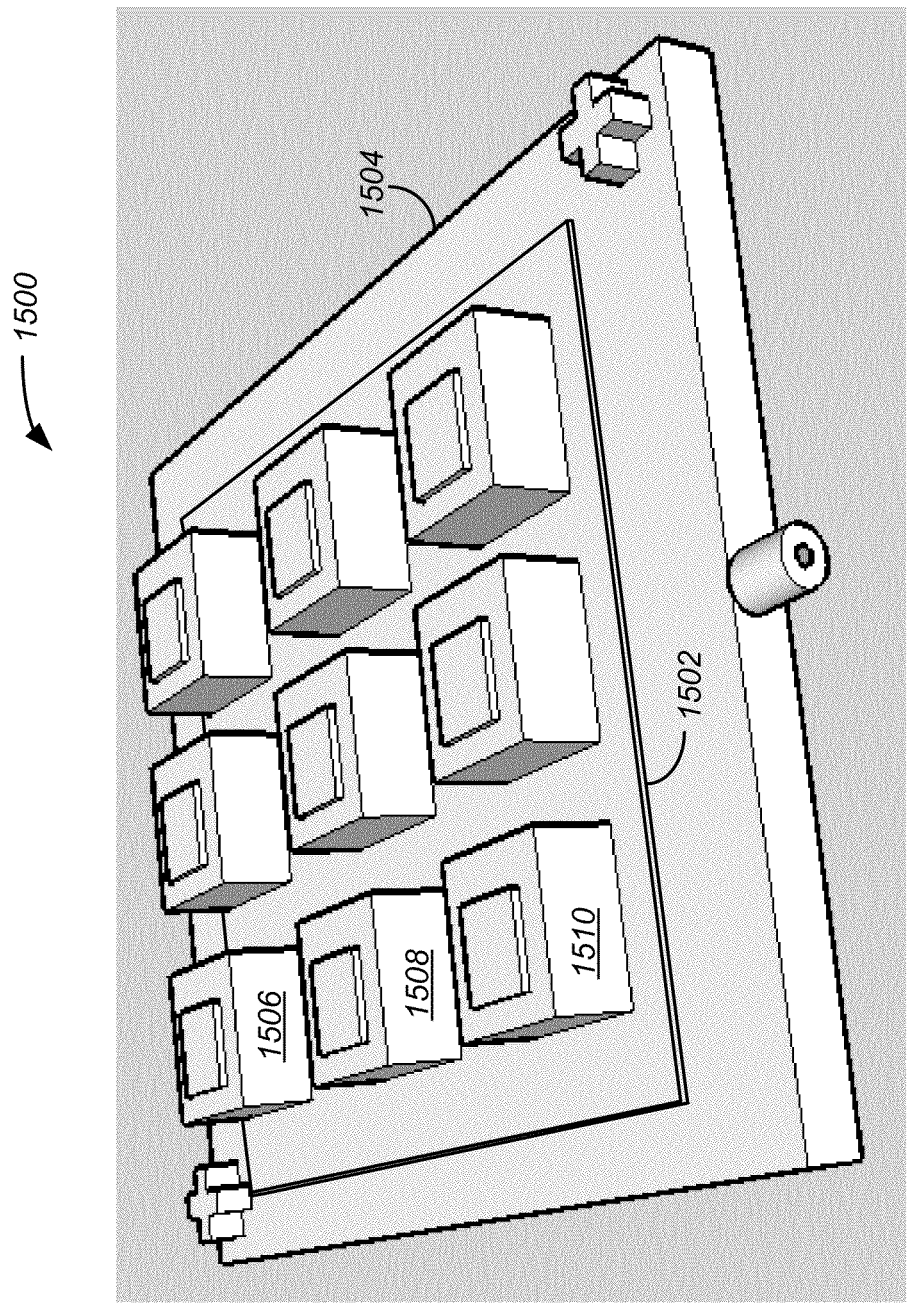
FIG. 15 illustrates an exemplary placement of an elastomeric material between a die carrier and die sub-carriers.

In some multi-level die carrier embodiments, and as shown in the multi-level die carrier 1500 illustrated in FIG. 15, an elastomeric material 1502 may be placed between a die carrier 1504 and its die sub-carriers 1506, 1508, 1510. By way of example, FIG. 15 illustrates a single sheet of elastomeric material 1502 placed between a die carrier 1504 and its die sub-carriers 1506, 1508, 1510. However, separate elastomeric elements could be provided for each die sub-carrier 1506, 1508, 1510, or separate elastomeric elements could be provided for different subsets of die sub-carriers. An advantage of providing an elastomeric material 1502 between a die carrier 1504 and its die sub-carriers 1506, 1508, 1510 is that it enables each die sub-carrier 1506, 1508, 1510 to move slightly in x, y, z and theta dimensions. This can be useful when registering a pick-and-place head or electrical contactor with the die sub-carriers 1506, 1508, 1510, as will be discussed in greater detail later in this description. Of note, a spring or springs could also be used to provide freedom of movement between a die carrier 1504 and its die sub-carriers 1506, 1508, 1510.

Although the multi-level die carriers 1200, 1300, 1400, 1500 shown in FIGS. 12-15 are associated with one level of die sub-carriers, any number of die sub-carrier levels, holding any number of singulated die or other die sub-carriers, could be employed.

Singulated die may be placed on die sub-carriers before or after the die sub-carriers are placed on a die carrier.

In some cases, an automated pick-and-place system may be used to place semiconductor die on a die carrier (or die sub-carrier). One exemplary pick-and-place system 1600 is shown in FIGS. 16A & 17. Although the system 1600 is shown to have only one pick-and-place head 1602, the system could alternately have multiple pick-and-place heads, or one pick-and-place head could be configured to pick multiple singulated die. Each pick-and-place head 1602 may "pick" a die 1604 using, for example, a vacuum.

When using a pick-and-place head 1602 to place singulated die 1604 on a die carrier or die sub-carrier 1606, the pick-and-place head 1602 may be provided with freedom of movement in the x, y, z and/or theta dimensions. Also, or alternately, a die sub-carrier 1606 may be provided with freedom of movement in the x, y, z and/or theta (Θ) dimension (see, e.g., FIG. 16A). In any case, this freedom of movement, coupled with registration features 1608, 1610, 1612 on the pick-and-place head 1602 and die carrier (or die sub-carrier 1606) can help to register a pick-and-place head 1602 with a die carrier (or die sub-carrier 1606), thereby correcting small alignment errors between the pick-and-place head 1602 and the die carrier (or die sub-carrier 1606).

The registration feature 1608 of the pick-and-place head 1602 shown in FIGS. 16A & 17 is a wall. Although the wall is shown to surround a picked die 1604, the wall could alternately be an L-shaped wall 1800, as shown in FIG. 18; or, a pick-and-place head could be provided with other registration features (such as one or more blocks, pins, balls or horizontal cylinders). Depending on its nature, a registration feature may be, for example, machined into a pick-and-place head or formed on a pick-and-place head 1602 (e.g., via a MEMS fabrication process). If the pick-and-place system 1600 is provided with multiple, independently movable, pick-and-place heads, the heads may be provided with individual or common registration features (or a mix of both—to grossly register all of the heads with a die carrier or die sub-carrier, and to individually register each head (or groups of heads) with particular singulated die or die sub-carriers).

FIG. 16A illustrates an exemplary registration of a pick-and-place head 1602 with a die carrier cavity 1614. As shown, the cavity walls 1616, 1618 of the die carrier cavity 1614 may have a feature such as a shelf (or shelf and sub-wall 1610, 1612) machined therein. The cavity walls 1616, 1618 above the machined feature 1610, 1612 may be sloped to guide the pick-and-place head 1602 into a defined position before a die 1604 is placed in the cavity 1614, with the shelf 1610, 1612 providing a z-stop for the pick-and-place head 1602. The cavity walls 1616, 1618 below the machined feature 1610, 1612 may also be sloped, to guide a die as it is dropped from (or placed by) the pick-and-place head 1602.

As will be discussed later in this description, an electrical contactor 302 (e.g., a device for probing the die 1604) may be provided with freedom of movement and/or a registration feature or features similar to those provided for the pick-and-place head 1602. See, FIG. 16B. In this manner, an electrical contactor 302 (or group of electrical contactors) may be registered with the cavity 1614 similarly to how a pick-and-place head 1602 may be registered with the cavity 1614.

Figure 19A:
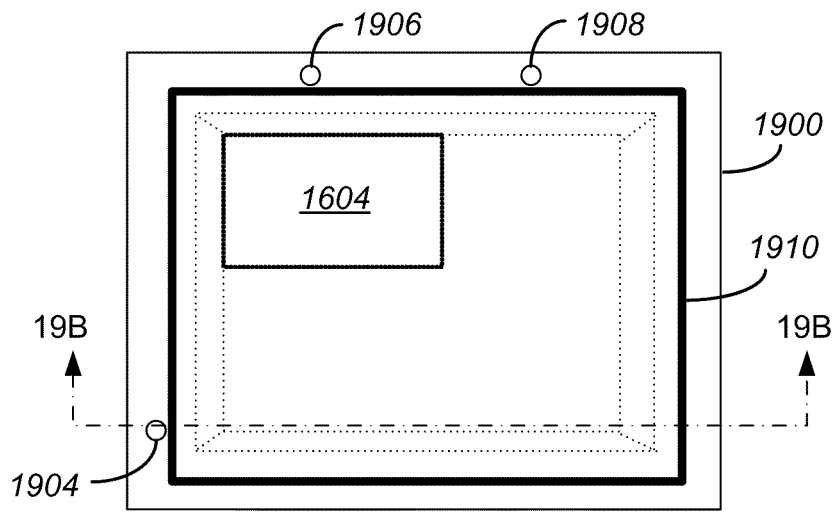
FIGS. 19A, 19B, 19C & 20 illustrate alternate ways to register a pick-and-place head or electrical contactor with a die carrier.
Figure 19B:
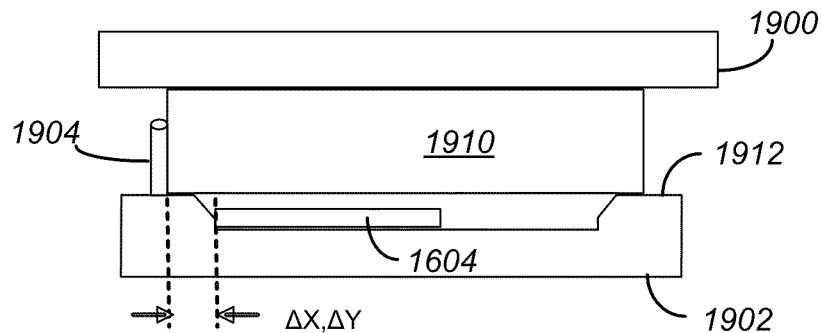
Figure 19C:
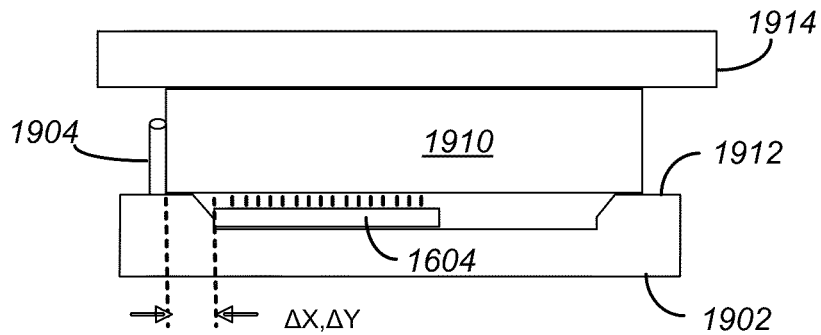

FIGS. 19A & 19B illustrate an alternate way to register a pick-and-place head 1900 with a die carrier or die sub-carrier 1902. That is, the die carrier 1902 shown in FIGS. 19A & 19B has one or more MEMS features (e.g., walls or posts 1904, 1906, 1908) formed thereon, and the pick-and-place head 1900 is moved using servo motors, stepper motors, piezoelectric actuators, air cylinders or other systems, until the walls 1910 of the pick-and-place head 1900 are registered with the MEMS feature(s) 1904, 1906, 1908. In this embodiment, a z-stop for the pick-and-place head 1900 may be provided by the surface 1912 of the die carrier 1902. An electrical contactor 1914 may be registered with a die carrier or sub-carrier 1902 in a similar fashion, as shown in FIG. 19C.

Figure 20:
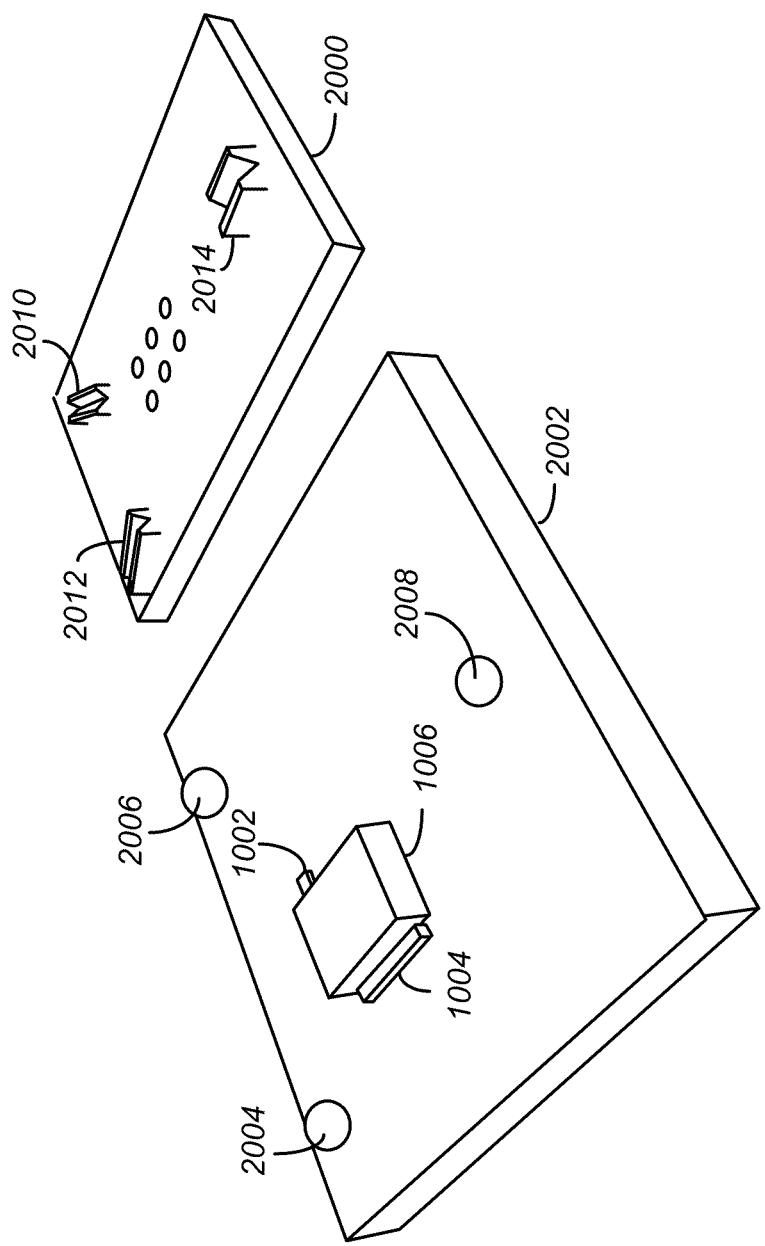

FIG. 20 illustrates yet another way to register a pick-and-place head 2000 with a die carrier or die sub-carrier 2002. As shown, either the pick-and-place head 2000 or the die sub-carrier 2002 may be provided with one or more balls 2004, 2006, 2008 (as shown), horizontal cylinders or other features that is/are designed to mate with corresponding V-grooves 2010, 2012, 2014 (as shown), concave cones or other features in or on the other one of the elements 2000, 2002.

Although various ways to register a pick-and-place head or electrical contactor with a die carrier (or die sub-carrier) have been discussed, other kinematic or non-kinematic features may also be employed to register a pick-and-place head.

The die carriers described thus far provide various mechanical means for registering singulated die with predetermined locations on the surfaces of the die carriers. Alternately (or additionally), semiconductor die may be aligned by 1) using optical or capacitive methods to determine where die are, and 2) using a pick-and-place head, mechanical finger or other element to move, slide or rotate the die into their desired positions. For example, and as shown in FIG. 12, a die carrier 1210 may be provided with one or more fiducials 1218, 1220, and an optically acquired image of the fiducial(s) 1218, 1220 may be compared to a desired image of the fiducial(s) 1218, 1220 to determine how a die 1202 should be placed or moved to achieve a proper alignment of the die 1202 on the die carrier 1210. Fiducials 1218, 1220 on a die carrier 1210 and die sub-carriers 1212, 1214, 1216 may also be used to align the die sub-carriers 1212, 1214, 1216 with the die carrier 1210. By way of example, fiducials 1218, 1220, 1222, 1224 may take the form of markings, scribed lines, machined features or MEMS features on a die carrier 1210 (or die sub-carrier 1212).

Figure 21:
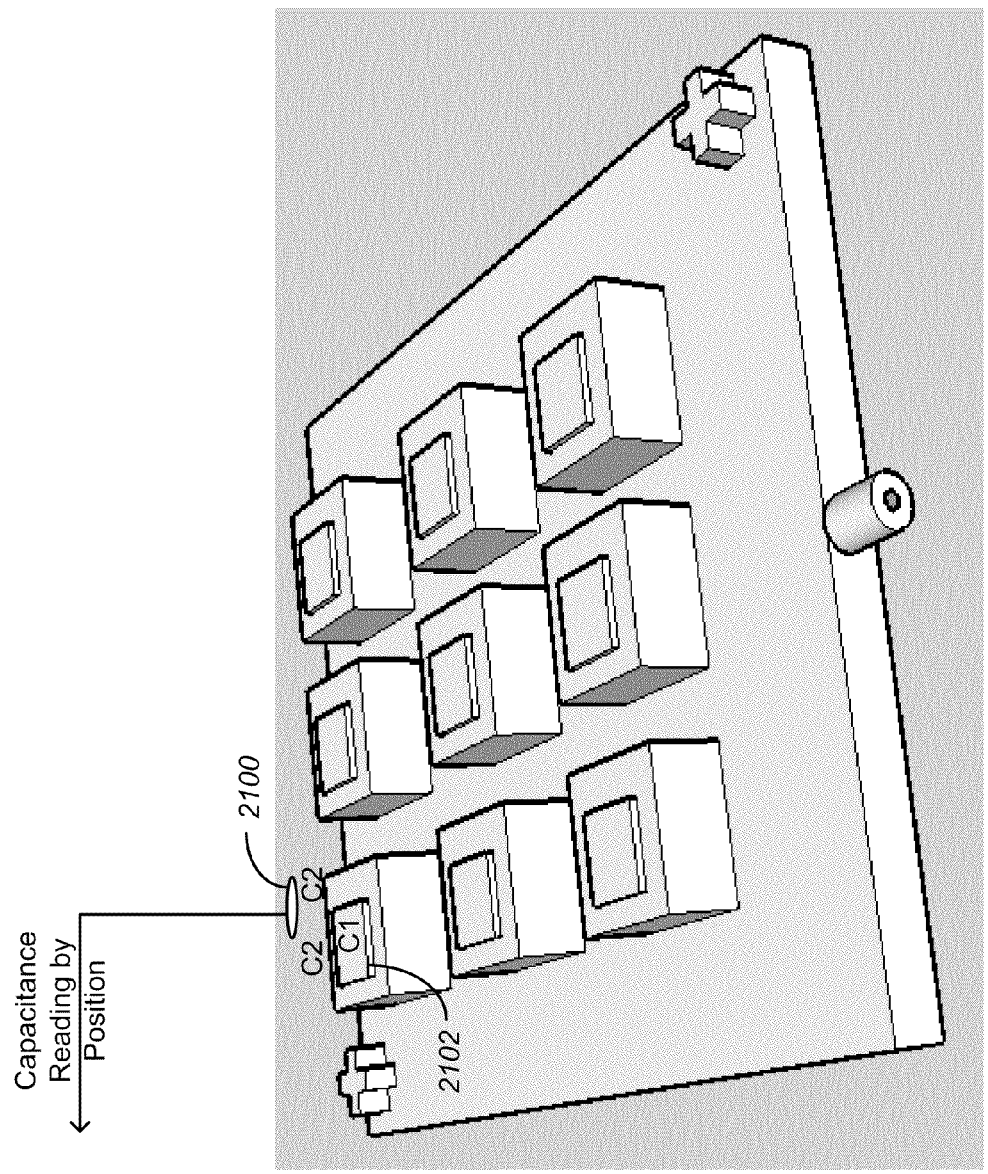
FIG. 21 illustrates the use of a capacitive probe to locate the edges of a singulated die.

As shown in FIG. 21, a capacitive probe 2100 could also be positioned or moved over a singulated die 2102, and a capacitive edge sense method may be used to determine where the die 2102 has been placed (e.g., by sensing various capacitances, such as C1 and C2. This information can then be compared to a desired die position to determine how or whether the die 2102 needs to be moved, slid or rotated into its desired position. A variety of capacitive edge sense methods have long been used to determine the correct placement of semiconductor wafers, for example, and these methods (or other methods) could be used to sense the edges of individual die.

In addition to using optical or capacitive methods to align semiconductor die on a die carrier (or die sub-carrier), optical and/or capacitive methods can be used to simply determine "where" semiconductor die are on a carrier. That is, so long as the die are approximately where they should be, optical or capacitive methods can be used to construct a map of where the semiconductor die actually are. The map can variously include: locations of die edges, intersections of die edges, locations of die electrical contacts (e.g., bond pads) with respect to fiducials or edges on the die carrier (or on die sub-carriers), or other elements. The map can be used to appropriately position each of the electrical contactors in an array, so that each semiconductor die is contacted by a corresponding electrical contactor. The positioning of electrical contactors will be discussed in greater detail later in this description, but for now, it is sufficient to note that semiconductor die need not be precisely registered or aligned with any particular feature, so long as their positions on a die carrier are approximately correct, and so long as their positions can be determined with sufficient resolution.

Figure 22:
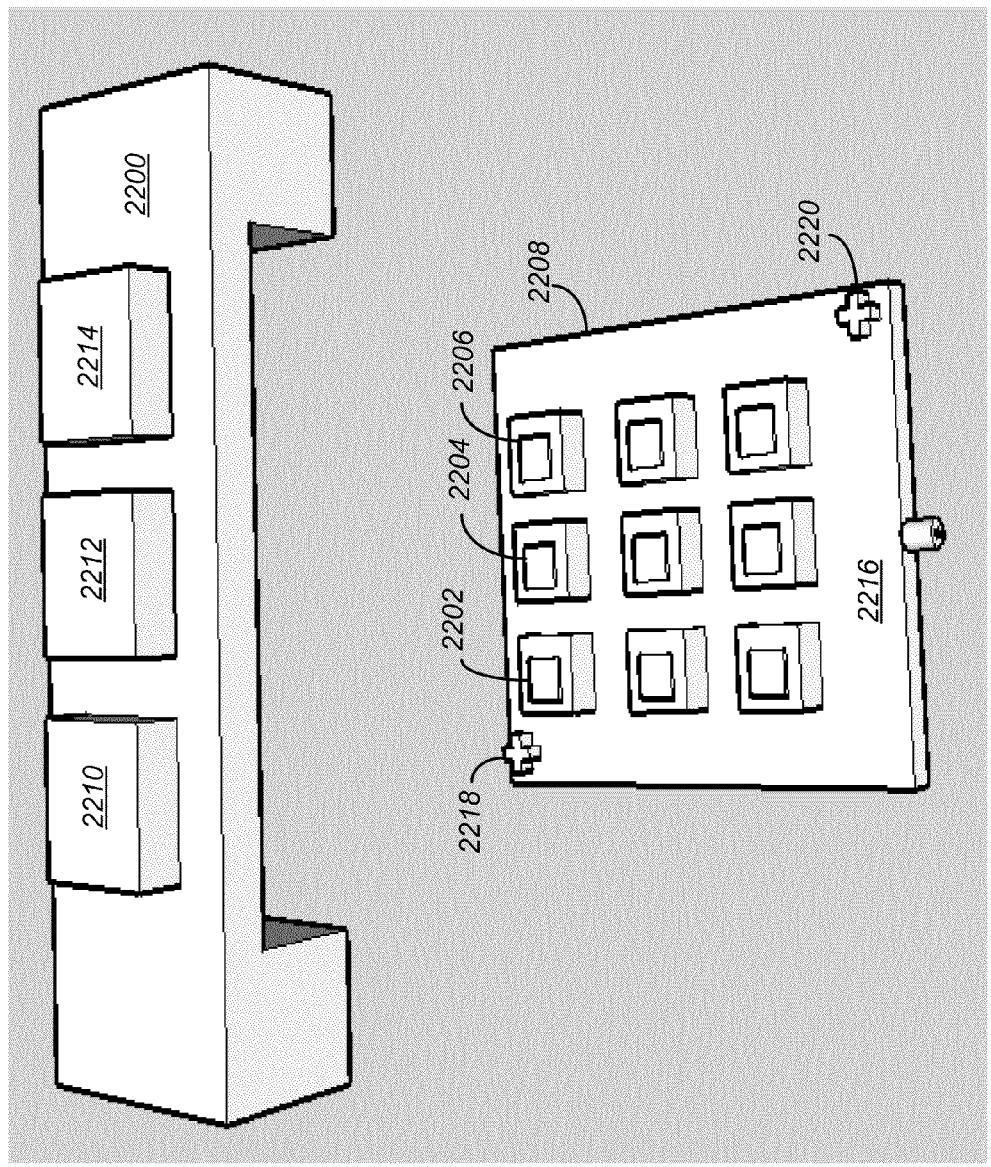
FIG. 22 illustrates an exemplary optical precising bridge.

By way of example, FIG. 22 illustrates the use of an optical "precising bridge" 2200 to determine where die 2202, 2204, 2206 have been placed on a die carrier 2208. The exemplary precising bridge 2200 is shown to have three optical detectors 2210, 2212, 2214, each of which images the die 2202, 2204, 2206 on a die carrier 2208. In some cases, the die 2202, 2204, 2206 may be imaged row-by-row as the die carrier 2208 is moved transverse to the precising bridge 2200. Machine vision software can then be used to compare the different two-dimensional images acquired by the optical detectors 2210, 2212, 2214, and in combination with 1) a known height of the detectors 2210, 2212, 2214 with respect to the surface 2216 of the die carrier 2208, and 2) known positions of the fiducials 2218, 2220, construct a map of where the die 2202, 2204, 2206 are positioned on the die carrier 2208. Various other optical mapping methods can also be employed, as would be understood by one of ordinary skill in the optical mapping or machine vision arts.

Although many of the above die carrier and die sub-carrier embodiments employ a carrier surface having cavities therein, or MEMS features thereon, the die carrying surface of a die carrier (or the die carrying surfaces of its sub-carriers) may simply be flat. This makes a die carrier much simpler to manufacture. A flat die carrier may be especially useful when die are simply aligned on the die carrier (and not registered with any sort of mechanical feature of a die carrier or die sub-carrier), or when the positions of die are simply mapped (without the undertaking of any sort of registration or alignment). As will be discussed below, however, a generally flat surface of a die carrier may in some cases comprise vacuum holes or other features for the purpose of adhering die to its surface.

Figure 23:
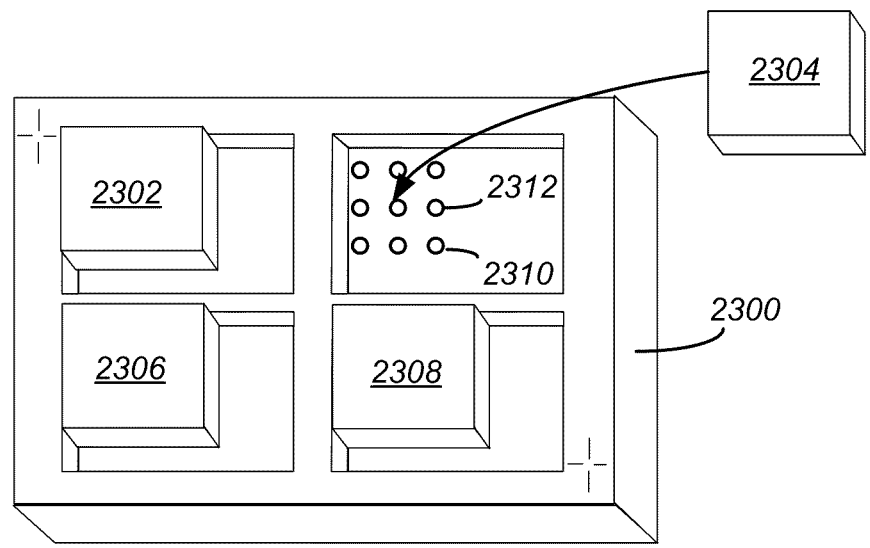
FIG. 23 illustrates a die carrier that employs a vacuum to adhere die to the die carrier.

During or after the placement of die on a die carrier or sub-carrier, it may be desirable to hold the die in place using a means other than gravity. To this end, the method 100 (FIG. 1) may further comprise a step of "adhering" each singulated die or die sub-carrier to the surface of the die carrier. In one embodiment, and as shown in FIG. 23, die 2302, 2304, 2306, 2308 may be adhered to the surface of a die carrier 2300 (and similarly, to the surfaces of die sub-carriers) by providing the carrier(s) 2300 with holes 2302, 2304 or other features for pulling a vacuum through the carrier(s) 2300. Alternately, a positive pressure hold system may be used to force die against a die carrier. A tacky substance on the surface of a die carrier, or MEMS latches, may also be used to adhere die to a die carrier.

Figure 24:
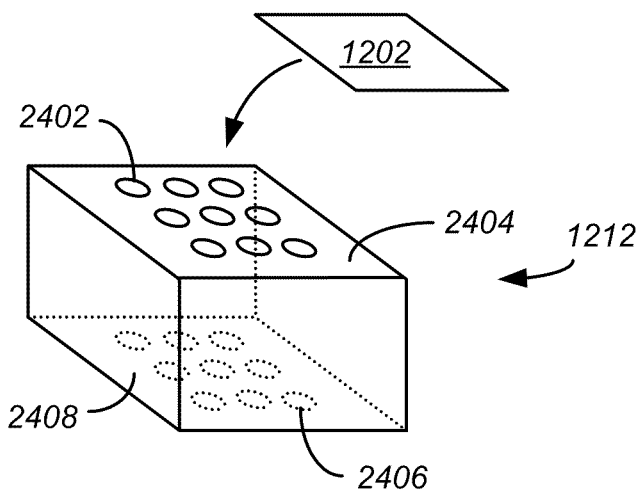
FIG. 24 illustrates a die sub-carrier that, in combination with a die carrier such as the die carrier shown in FIG. 23, employs a vacuum to adhere a die.

As shown in FIG. 12, a vacuum may be pulled through a die carrier 1210 by attaching a vacuum system to a vacuum port 1226 of the die carrier 1210. In some cases, the vacuum may be maintained via continued operation of the vacuum system. In other cases, the vacuum may be maintained by means of a check valve or similar device (not shown). When die sub-carriers 1212, 1214, 1216 are employed, each die sub-carrier 1212, 1214, 1216 may be provided with its own vacuum port. Or, preferably, die sub-carriers 1212 (see FIG. 24) may be provided with holes 2402 on their die carrying surfaces 2404 and holes 2406 on surfaces 2408 opposite their die carrying surfaces 2404. When the die sub-carriers 1212, 1214, 1216 are placed on a die carrier 1210, a single vacuum may be pulled through the die carrier 1210 and die sub-carriers 1212, 1214, 1216. In some cases, the holes on the surface of the die carrier 1210, or the holes on the bottom surfaces of the die sub-carriers 1212, 1214, 1216, may be sized larger than the holes on, for example, the surfaces of the die sub-carriers 1212, 1214, 1216 on which singulated die 1202, 1204, 1206 are placed. This can mitigate the need to closely align corresponding holes on the die carrier 1210 and die sub-carriers 1212, 1214, 1216.

When die sub-carriers are employed 1212, 1214, 1216, the die sub-carriers 1212, 1214, 1216 can also be adhered to the surface 1208 of a die carrier 1210 using glue. For example, an ultraviolet curable epoxy may be applied to the surface 1208 of a die carrier 1210 (or to the undersides of die sub-carriers 1212, 1214, 1216) and then altered (e.g., cured) to adhere or release the die sub-carriers 1212, 1214, 1216 from the die carrier 1210. A tacky substance on the surface of a die carrier, or MEMS latches, may also be used to adhere die sub-carriers to a die carrier.

In cases where an elastomeric material 1502 (FIG. 15) is employed between a die carrier 1504 and its die sub-carriers 1506, 1508, 1510, the elastomeric material 1502 may comprise holes for enabling a single vacuum to be pulled through the die carrier 1504 and die sub-carriers 1506, 1508, 1510.

Depending on the tests being performed on a plurality of singulated die, the temperature of a die carrier and its die may need to be increased (e.g., to 90° C.) or decreased (e.g., to −45° C.) prior to testing the die that have been placed on the die carrier. In these cases, the die carrier and die may be heated before or after placement of the die. In some cases, the die carrier and die may be heated prior to final registration, alignment or mapping of the die on the die carrier. In this manner, any thermal expansion of the die carrier or die can be factored into the registration, alignment or mapping of the die. Also, and depending on the method used to adhere die to their carrier(s), it may be beneficial to heat the carrier(s) and die prior to adhering the die to the carrier(s). One way to heat a die carrier, and thereby heat a plurality of singulated die, is via a thermal soaking operation.

In some cases, the effects of thermal expansion of die and die carriers can be compensated for by matching or compensating for the coefficients of thermal expansion (CTE) of the involved elements. For example, assuming silicon die, the die carrier or die sub-carriers could be formed of a material with a similar CTE, such as ceramic, kovar or invar. If a die carrier is made of another material, and the CTE mismatch between the die carrier and its die is large, one way to bridge the CTE mismatch is to employ die sub-carriers formed of a material having an intermediate CTE.

Having described various ways to configure and use a die carrier, various ways of configuring an array of electrical contactors will now be discussed.

Figure 25:
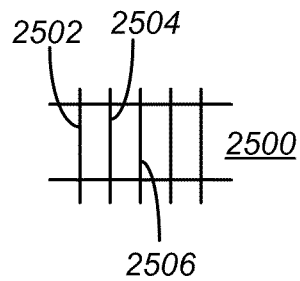
FIG. 25 illustrates exemplary vertical contact pins.
Figure 26:
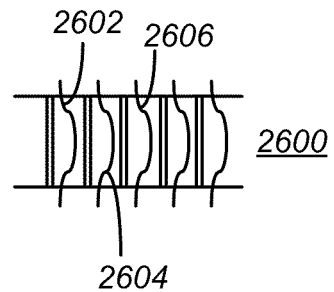
FIG. 26 illustrates exemplary buckling beam pins.
Figure 27:
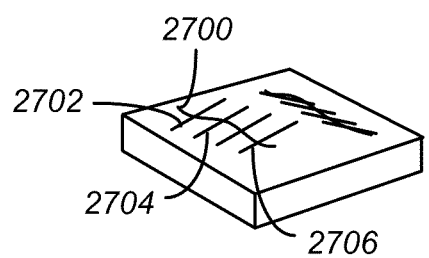
FIG. 27 illustrates exemplary cantilever needles.
Figure 28:
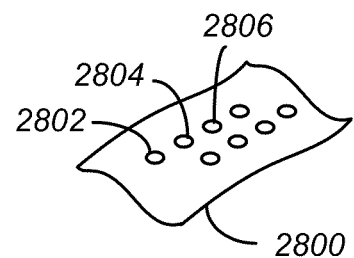
FIG. 28 illustrates exemplary bumps on a flex circuit.
Figure 29:
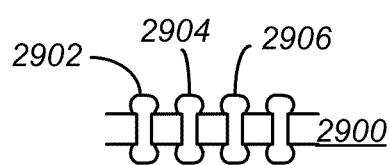
FIG. 29 illustrates exemplary conductive elastomer bumps.
Figure 30:
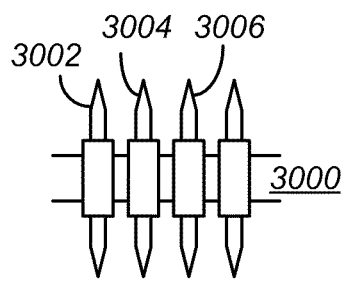
FIG. 30 illustrates exemplary MEMS spring pins.

As used herein, a singular "electrical contactor" is a device that provides an electrical interface to one singulated die. In one form, an electrical contactor may comprise a substrate with a plurality of electrical contacts extending therefrom. The substrate may take various forms, including those of: a printed circuit board (PCB), a high-temperature cofired ceramic (HTCC) substrate, or a low-temperature cofired ceramic (LTCC) substrate. The electrical contacts may also take various forms, including those of: vertical contact pins 2502, 2504, 2506 mounted to a substrate 2500 (FIG. 25); buckling beam pins 2602, 2604, 2606 mounted to a substrate 2600 (FIG. 26); cantilever needles 2702, 2704, 2706 assembled in an epoxy 2700 or other substance (FIG. 27); conductive bumps 2802, 2804, 2806 formed on a flex circuit 2800 or other membrane (FIG. 28); conductive elastomer bumps 2902, 2904, 2906 embedded in a substrate 2900 (FIG. 29); or pogo pins or MEMS spring pins 3002, 3004, 3006 embedded in a substrate 3000 (FIG. 30). In some cases, the electrical contacts may comprise MEMS contact elements that are co-fabricated on a substrate in parallel. In other cases, MEMS contact elements may be individually coupled to a substrate. Still alternately, the electrical contacts may comprise field-coupled transmitters/receivers (e.g., AC-coupled transmitters/receivers) that make "electrical contact" without making "mechanical contact".

Figure 31:
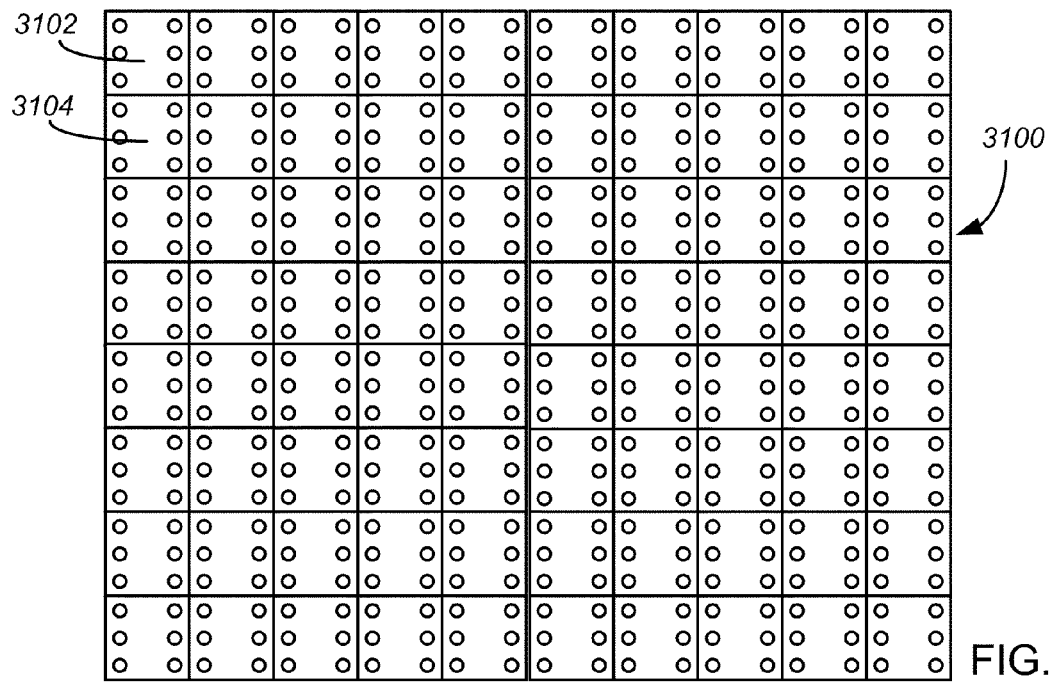
FIG. 31 illustrates a first exemplary array of electrical contactors.

In one embodiment, an array of electrical contactors may be formed similarly to any of a wide range of conventional probe cards. However, because of the singulation of the die, the electrical contactors need not be laid out in a pattern that matches the formation of die on a wafer. Also, the number of electrical contactors can far exceed the number of die that are formed on a wafer. FIG. 31 illustrates one exemplary array 3100 of electrical contactors 3102, 3104, wherein the contactors 3102, 3104 are arranged in a rectangular grid, and wherein the contactor grid is not confined to a generally circular periphery (such as the periphery of a wafer).

In another embodiment, an array of electrical contactors may be formed of individual or groups of electrical contactors, which individual or groups of electrical contactors can be independently replaced and/or maneuvered. When individual or groups of electrical contactors are independently replaceable, the failure of one electrical contactor (or one group of electrical contactors) does not result in a need to discard the entire array. When individual or groups of electrical contactors are independently maneuverable, better registration and electrical continuity can be achieved between the electrical contactors (or groups of electrical contactors) and their respective die.

Figure 32:
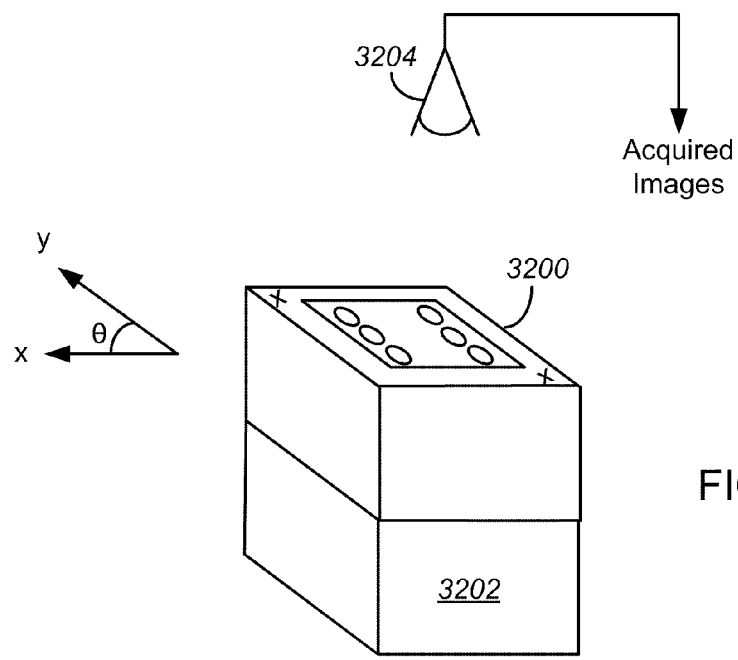
FIG. 32 illustrates a second exemplary array of electrical contactors.

When a plurality of individual electrical contactors (or groups of electrical contactors) are assembled to form an array of electrical contactors, the positions of the electrical contactors need to be known. In one embodiment, and as shown in FIG. 32, each electrical contactor 3200 (or grouping thereof) may be coupled to its own set of servo motors, stepper motors or piezoelectric actuators 3202, so that the electrical contactor 3200 can be moved to a desired position. In some cases, the position of an electrical contactor 3200 may be controlled by optically acquiring an image of the electrical contactor 3200 (e.g., via a camera 3204), comparing the acquired image to an expected image, and then using differences in the acquired and expected images to determine how or whether the electrical contactor 3200 should be moved.

If a plurality of singulated die are registered or aligned in accord with known positions, then only small if any movements of electrical contactors may be necessary to adequately align an array of electrical contactors with a plurality of singulated die. In these cases, a plurality of electrical contactors may be assembled onto a common substrate in much the same way as a plurality of singulated die are assembled (or placed) on a die carrier, but with a need to provide electrical connections through the common substrate. Due to the fact that one array of electrical contactors is typically used to test numerous arrays of singulated die, electrical contactors may in some cases be adhered to substrates using more permanent methods than those that are used to adhere die to a die carrier (e.g., via glues or epoxies, such as a UV-curable epoxy, vs. a vacuum).

Figure 33:
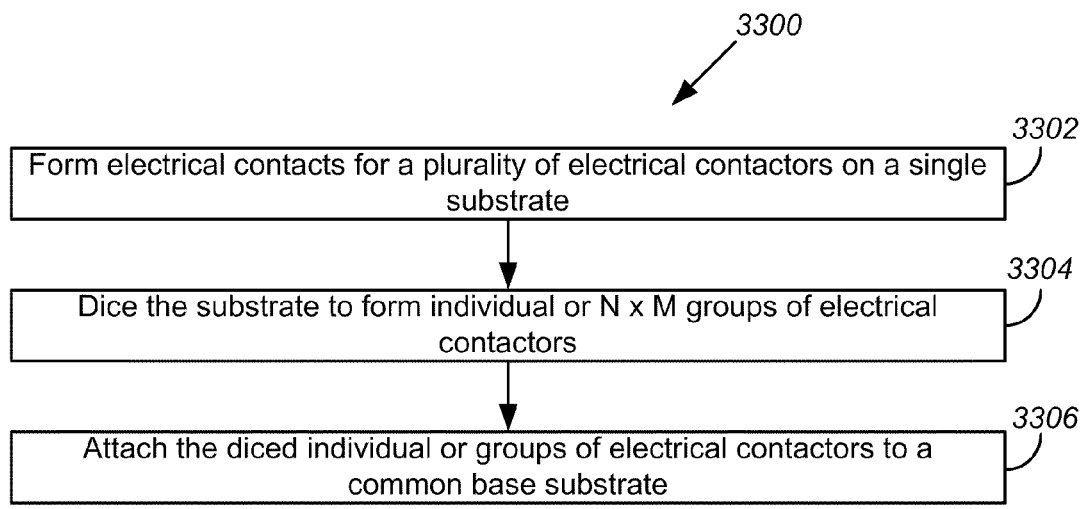
FIG. 33 illustrates an exemplary method for assembling an array of electrical contactors on a substrate.

FIG. 33 illustrates one exemplary method 3300 for assembling an array of electrical contactors on a substrate. Of note, the steps of the method 3300 may be performed in orders other than the order shown. The method 3300 comprises forming the electrical contacts for a plurality of electrical contactors on a single substrate (at block 3302). The substrate has one or more layers of material upon which (or through) metallic traces are routed. The metallic traces connect to ones of the electrical contacts, and in some cases provide electrical paths to the back of the substrate. After the electrical contacts have been formed, the substrate may be diced to form individual or N×M groups of electrical contactors (at block 3304). If the electrical contactors are diced with precision using, for example, a laser cutting process, the edges of the electrical contactors may be used as registration features (similar to the walls of the electrical contactor shown in FIG. 16B and pick-and-place head shown in FIGS. 16A and 17).

After forming the electrical contacts and any registration features, the diced individual or groups of electrical contactors are then attached to a common base substrate (at block 3304). See, e.g., FIG. 3, where a plurality of contactors 302, 304, 306, 308 are attached to the substrate 300. Preferably, the base substrate is formed of a material that has a CTE that is the same (or similar to) that of the die that are being contacted. In the case of silicon die, the material of the base substrate might be ceramic, kovar or invar. By way of example, the electrical contactors may be attached to the base substrate using a glue or epoxy, such as an ultraviolet curable epoxy. The base substrate 300 may be provided with two or more fiducials 310, 312 (FIG. 3) for aligning the electrical contactors 302, 304, 306, 308 on the base substrate 300 using an optical alignment process (i.e., machine vision). The base substrate may comprise one or more layers of material upon which (or through) metallic traces are routed. The metallic traces connect to corresponding traces on the substrates of the electrical contactors and serve to provide electrical connections between a test system, such as automated test equipment (ATE), and the base substrate. The base substrate 300 may also be (or comprise) a printed circuit board (PCB), or other form of substrate, having traces or routes that carry signals to and from the electrical contactors 302, 304, 306, 308.

Figure 34:
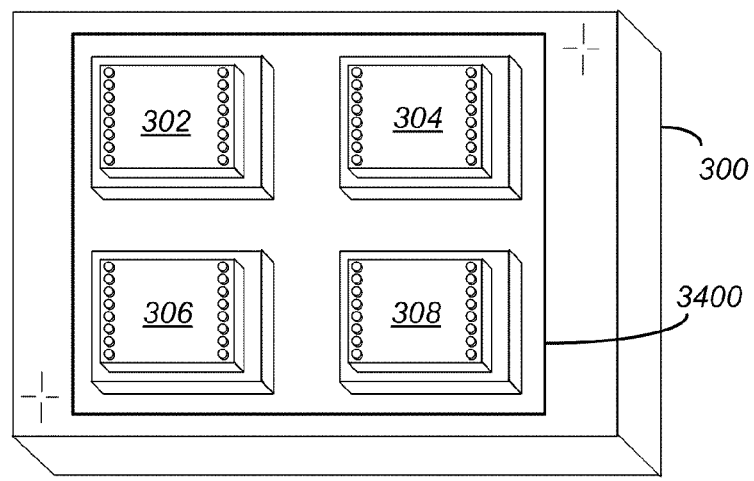
FIG. 34 illustrates an elastomeric interposer placed between an array of electrical contactors and a base substrate.

In some embodiments of the method 3300, an elastomeric interposer (3400) may be placed between the electrical contactors 302, 304, 306, 308 and the base substrate 300. See, FIG. 34. Alternately, separate elastomeric interposers could be provided for each electrical contactor (or for each electrical contactor group). An exemplary cross-section of an elastomeric interposer is shown in FIG. 29 and comprises a frame or substrate 2900 that holds a plurality of conductive elastomer bumps 2902, 2904, 2906. An advantage of using an elastomeric interposer 3400 (or interposers) is that it enables each electrical contactor 302, 304, 306, 308 or contactor group to move slightly in x, y, z and theta dimensions. This can be useful when registering the electrical contactors 302, 304, 306, 308 with a plurality of singulated die. Of note, a spring or springs could also be used to provide freedom of movement between electrical contactors and a base substrate.

In some embodiments of the method 3300, a mechanical z-stop, such as a number of walls or posts, may be co-fabricated with the electrical contacts (e.g., via a MEMS fabrication process). Mechanical registration features or fiducials may also be co-fabricated with the electrical contacts. The registration features may take various forms, such as those shown in FIGS. 16-20 and discussed previously with respect to a pick-and-place head.

Having described various exemplary ways to place singulated die on a die carrier, and various exemplary ways to form an array of electrical contactors, various methods and apparatus for mating an array of electrical contactors with a plurality of singulated die will now be discussed.

Figure 35:
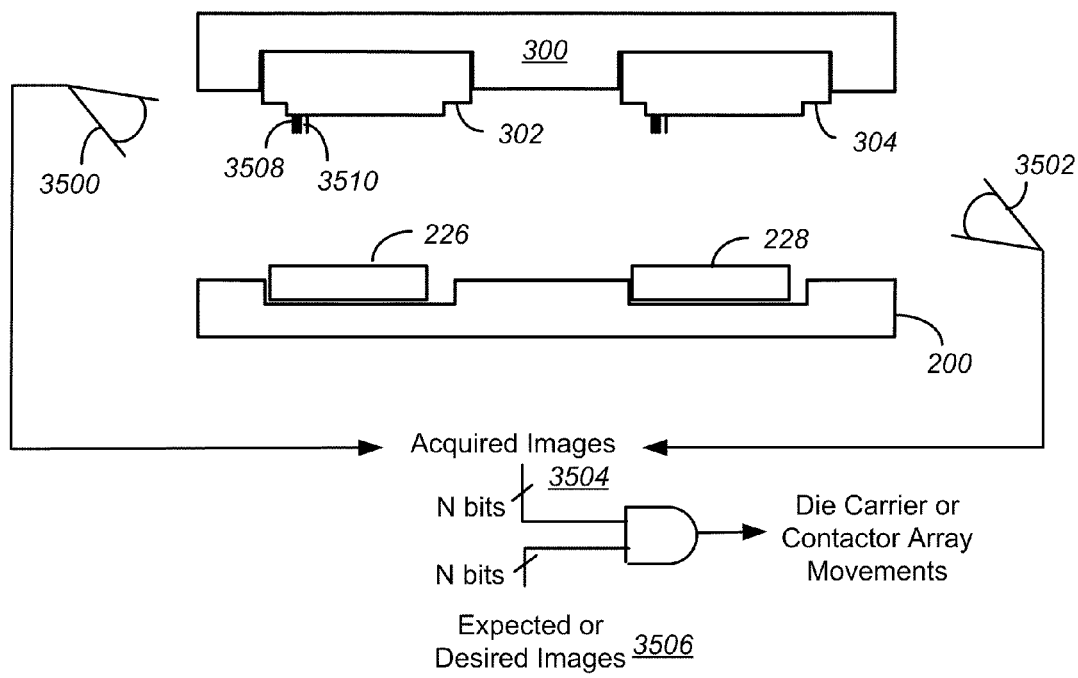
FIG. 35 illustrates the use of cameras to align the die carrier and array of electrical contactors shown in FIGS. 2 & 3.

FIGS. 2 & 3 illustrate an exemplary die carrier 200 and array of electrical contactors 302, 304, 306, 308, each of which are provided with fiducials 230, 232, 310, 312. As shown in FIG. 35, the die carrier 200 and electrical contactors 302, 304 are aligned with one another by 1) using one or more cameras 3500, 3502 to acquire images 3504 of the fiducials 230, 232, 310, 312, and 2) comparing the acquired images 3504 to desired images 3506 to determine how or whether one or both of the die carrier 200 and the electrical contactor array 302, 304 should be moved in x, y and theta dimensions. Movements in x, y and theta dimensions may be achieved via motors, piezoelectric actuators, air cylinders or other mechanisms. Once aligned, one or both of the die carrier 200 and electrical contactor array 302, 304 may be moved in a z-dimension (i.e., toward the other element) to mate the array of electrical contactors 302, 304 with a plurality of singulated die 226, 228. Mechanical z-stops such as pins or walls may be provided on the die carrier 200 or contactor array, to provide the right amount of compression of the electrical contacts 3508, 3510 on the electrical contactors 302, 304 (and prevent over-compression). At the conclusion of test, the die carrier 200 or electrical contactor array 302, 304 may be actuated in the opposite z-direction, and the singulated die 226, 228 on the die carrier 200 may be unloaded and sorted (based, for example, on whether die 226, 228 are determined to be good, bad, or good within certain limits).

Figure 36:
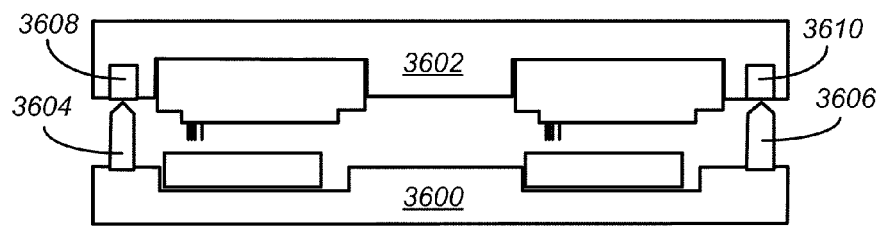
FIG. 36 illustrates an exemplary way to align and mate a die carrier and array of electrical contactors.

FIG. 36 illustrates another exemplary way to align and mate a die carrier 3600 and array of electrical contactors 3602. As shown, the carrier 3600 (or alternately the contactor array 3602) may be provided with a pair of alignment pins 3604, 3606, and the contactor array 3602 (or carrier 3600) may be provided with a pair of precision located and drilled alignment holes 3608, 3610 (or routed depressions). To align the die carrier 3600 and the contactor array 3602, the two elements 3600, 3602 are grossly aligned prior to moving the two elements 3600, 3602 toward one another in a z-direction. As rounded or tapered heads of the alignment pins 3604, 3606 make contact with the alignment holes 3608, 3610, one or both of the die carrier 3600 and electrical contactor array 3602 are urged into alignment with the other. The depth of the holes 3608, 3610 or length of the pins 3604, 3606 may be used as z-stops.

Referring back to FIGS. 16B & 17, yet another way to align and mate a die carrier 1606 and array of electrical contactors is illustrated. That is, the same sort of wall 1608 that is formed on a pick-and-place head 1602 (e.g., an electro formed wall) may be formed on an electrical contactor 302. In some cases, the wall 1608 may be co-fabricated with the electrical contacts 1622 of a contactor 302, using the same fabrication process. If the contactor 302 is provided with some amount of freedom of movement in the x, y and theta dimensions, the wall's contact with the wall or shelf 1610, 1612 of the die cavity 1614 causes the contactor 302 to move as necessary so that it properly aligns with a die 1604.

In yet another embodiment, and similar to what is disclosed in FIG. 16B, an electrical contactor may be diced from a substrate with a high degree of precision (e.g., by means of a laser cutting process). The wall of the electrical contactor may then be used for registration with a die cavity 1604, similarly to how an electro formed wall would be used.

Referring back to FIGS. 19A & 19C, still another way to align and mate a die carrier and array of electrical contactors is illustrated. That is, the MEMS features (e.g., walls or posts 1904, 1906, 1908) formed on the die carrier 1902 shown in FIGS. 19A/19B may be used for registration of an electrical contactor 1914. In one embodiment, and as shown in FIGS. 19A & 19C, the MEMS features may comprise three posts 1904, 1906, 1908. By moving an electrical contactor 1914 close to the surface of the die carrier 1902, and then moving the contactor 1914 in x, y and/or theta dimensions, the electrical contactor 1914 can be registered with the MEMS features 1904, 1906, 1908. Once registered, the electrical contactor 1914 can be further moved in the z dimension until it bottoms out on the surface 1912 of the die carrier 1902. All movements of the electrical contactor 1914 may be accomplished using servo motors, stepper motors, piezoelectric actuators, air cylinders or other systems. To ensure proper mating of the electrical contactor 1914 with a die 1604, the surface 1912 of the die carrier 1902 should be precisely machined (i.e., flat).

Another way to align and mate a die carrier and array of electrical contactors is to align or map a plurality of singulated die on a die carrier, and then use the known or mapped alignment to move electrical contactors into precise positions, prior to mating the electrical contactors with the die on the die carrier.

Figure 37:
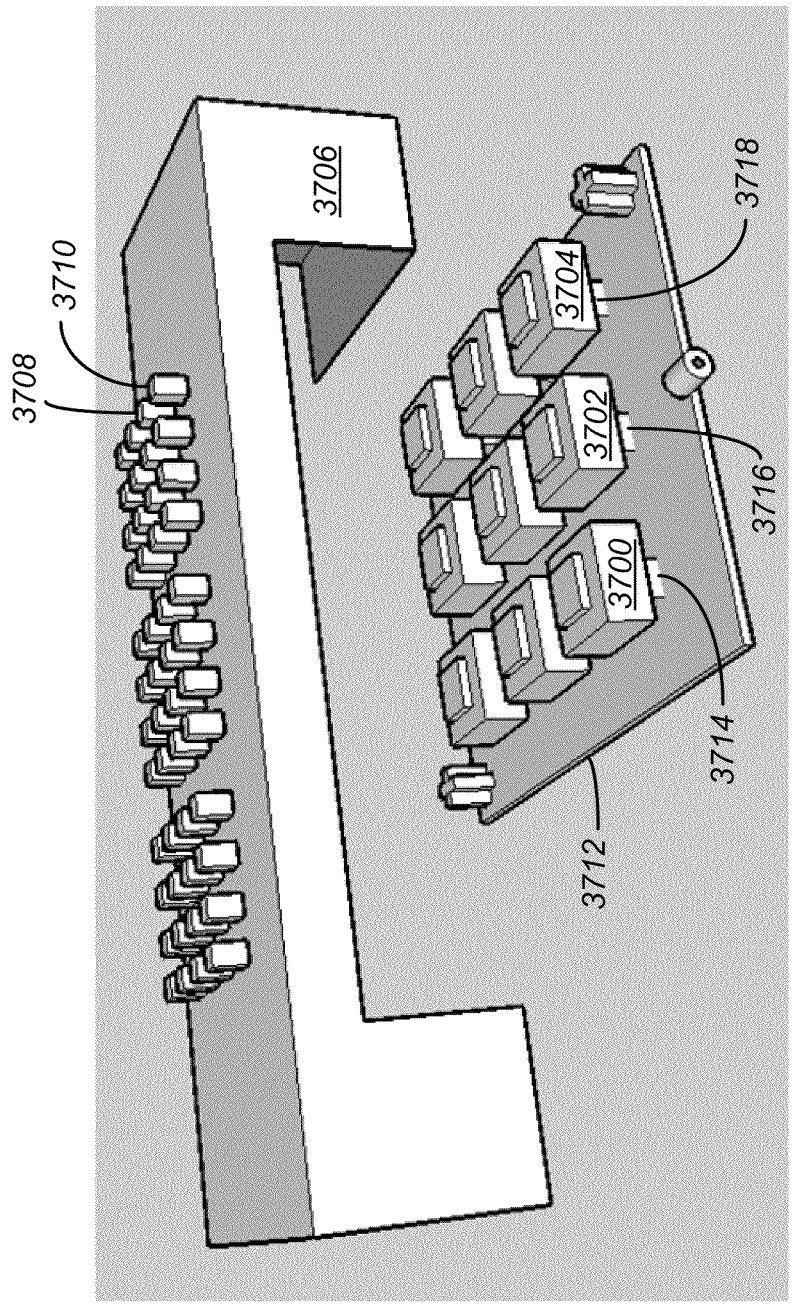
FIG. 37 illustrates a column of die sub-carriers passing through a precising bridge.

Still another way to align and mate a die carrier and array of electrical contactors is to align singulated die with fiducials on individual die sub-carriers. Then, in response to a map of electrical contactor positions, fiducials on a die carrier and the die sub-carriers may be used to align each of the die sub-carriers with a corresponding electrical contactor. Each die sub-carrier may be moved in x, y and theta dimensions. As shown in FIG. 37, one or more columns of die sub-carriers 3700, 3702, 3704 may be aligned, in parallel, at a "precising bridge" 3706. By way of example, the precising bridge 3706 is shown to have a number of capacitive sensors 3708, 3710, though optical sensors could also be used. Also by way of example, each die sub-carrier 3700, 3702, 3704 is shown to be mounted to the die carrier 3712 via one or more piezoelectric elements 3714, 3716, 3718. In this manner, the die sub-carriers 3700, 3702, 3704 may be individually moved to optimum positions in x, y and theta dimensions. Alternately, other technologies may be used to move or nudge the die sub-carriers 3700, 3702, 3704 into desired positions. These technologies include servo motors, stepper motors, piezoelectric actuators and air cylinders. Of note, capacitive or optical measurements of a die sub-carrier's position may be used to provide closed-loop feedback of any alignment or "nudging" elements.

In some embodiments, an array of electrical contactors may be mated with a plurality of singulated die by mating corresponding kinematic features on the die carrier and the array of electrical contactors. For example, the arrangement shown in FIG. 20 may be employed, wherein 1) one or more V-grooves 2010, 2012, 2014 are machined or formed in/on an electrical contactor instead of a pick-and-place head 2000, and 2) one or more balls 2004, 2006, 2008 are attached to a die carrier 2002. By way of example, the V-grooves may be formed using a MEMS process, such as a Silicon KOH etch process where a sloped wall is sputtered and plated, and silicon is then etched away to leave a metal geometry with sloped walls.

Figure 38:
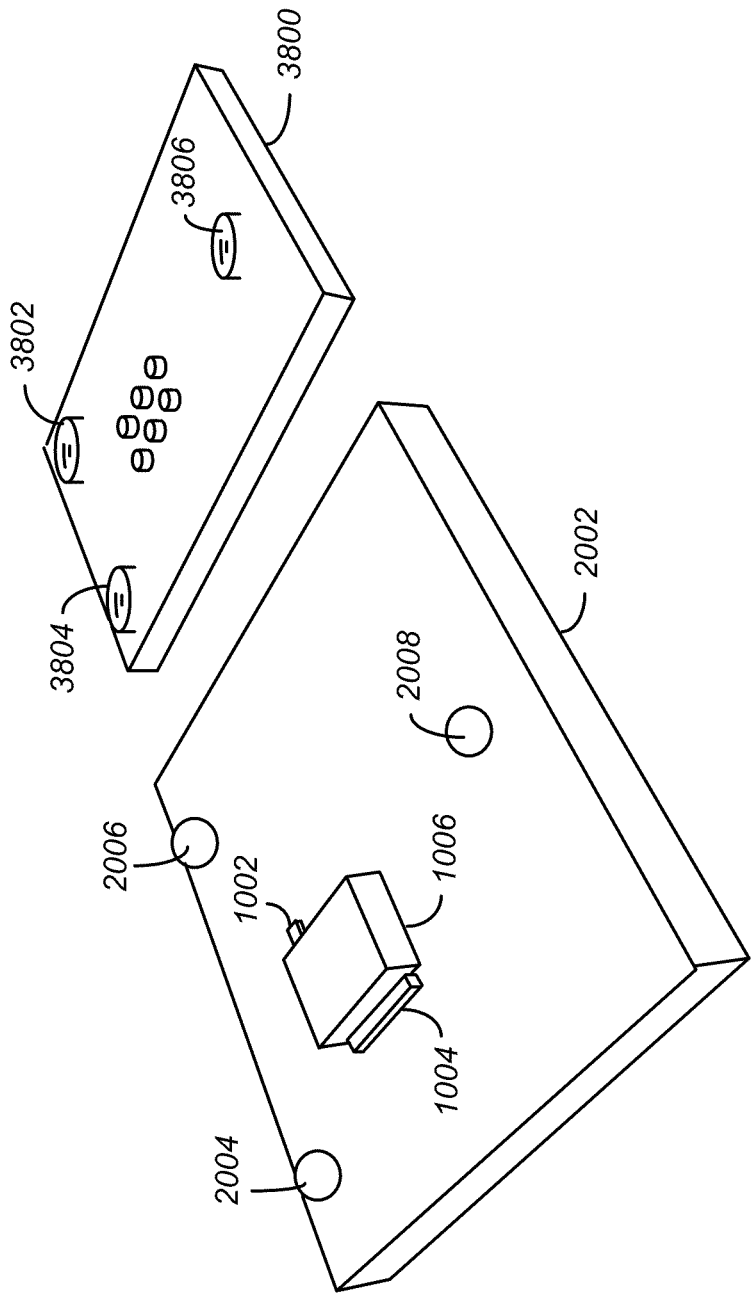
FIG. 38 illustrates pairs of kinematic alignment features.

FIG. 38 illustrates a set of balls 2004, 2006, 2008 attached to a die carrier 2002 and a set of concave conical features 3802, 3804, 3806 machined or formed in/on an electrical contactor 3800. Still other pairs of corresponding kinematic features can be employed. In all cases, one or more degrees of freedom in electrical contactor or die carrier movement are required, so that corresponding kinematic features can pull the electrical contactor, die carrier or die sub-carrier into position.

Figure 39:
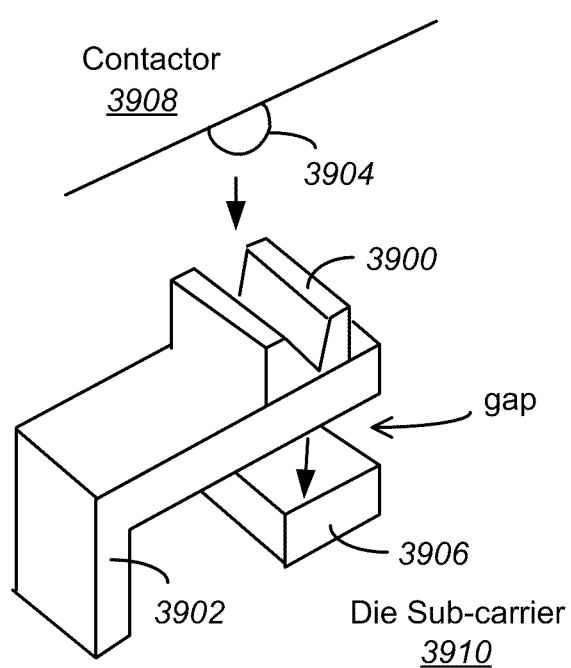
FIG. 39 illustrates a kinematic alignment feature atop a spring assembly.

FIG. 39 illustrates a kinematic alignment feature (e.g., a V-groove 3900) atop a spring assembly 3902, which alignment feature 3900 and spring assembly 3902 can be formed using a MEMS process. The spring assembly 3902 provides a sequence to the contactor/sub-carrier mating process, whereby 1) x, y and theta registration of the contactor-to-sub-carrier is first achieved as the ball 3904 is mated with the alignment feature 3900, 2) z-compression occurs because of the spring assembly 3902, and 3) a hard z-stop 3906 associated with the aforementioned spring assembly 3902 ensures that the electrical contacts of the contactor 3908 are not over-compressed as the contactor 3908 is mated with the die sub-carrier 3910.

Of note, any of the above contactor/carrier mating methods may be applied to the mating of 1) individual or grouped electrical contactors with 2) either a die carrier or die sub-carriers. Also, any alignment steps taken (or apparatus used) to align a plurality of electrical contactors could likewise be taken to align a plurality of singulated die.

In some cases, multiple, tiered contactor/carrier alignment mechanisms may be employed, such as pairs of alignment pins and holes to grossly align an array of electrical contactors with a die carrier, and per contactor/die sub-carrier kinematic alignment mechanisms for fine alignment of individual contactors with their respective die.

What is claimed is:

1. A method of mating an array of electrical contactors with a plurality of singulated semiconductor die, the method comprising:
   placing the plurality of singulated semiconductor die on a plurality of die subcarriers, said plurality of die sub-carriers having a plurality of registration features thereon;
   supporting each die sub-carrier with a die carrier, each die sub-carrier being independently moveable with respect to the die carrier while being supported by the die carrier; and
   mating the plurality of singulated semiconductor die with the array of electrical contactors after the singulated semiconductor die have been placed on the die subcarriers, and after the die sub-carriers have been supported by the die carrier, said array of electrical contactors having a second plurality of registration features, said second plurality of registration features corresponding to the first plurality of registration features, said mating causing corresponding ones of the first and second pluralities of registration features to register with one another and move at least one of the die sub-carriers with respect to the die carrier.

2. The method of claim 1, wherein causing movement of at least one of the die sub-carriers comprises causing movement in an elastomeric element positioned between one of the die sub-carriers and the die carrier.

3. The method of claim 1, wherein causing movement of at least one of the die sub-carriers comprises causing movement of a spring that attaches one of the die sub-carriers to the die carrier.

4. Apparatus for testing a plurality of singulated semiconductor die, comprising:
   a multi-level die carrier having a plurality of die sub-carriers that are moveably attached to a die carrier, wherein each die sub-carrier is independently moveable with respect to the die carrier while being supported by the die carrier, and wherein each die sub-carrier is configured to hold one or more of the singulated semiconductor die; and
   an array of electrical contactors configured to contact the singulated semiconductor die carried on the multi-level die carrier.

5. The apparatus of claim 4, wherein the multi-level die carrier comprises at least one elastomeric element positioned between at least one of the die sub-carriers and the die carrier.

6. The apparatus of claim 4, wherein the multi-level die carrier comprises a plurality of motors or actuators positioned between the die sub-carriers and the die carrier, said motors or actuators configured to move the die sub-carriers with respect to the die carrier.

7. The apparatus of claim 4, wherein the multi-level die carrier has a first plurality of registration features thereon, and wherein the array of electrical contactors has a second plurality of registration features, the second plurality of registration features corresponding to the first plurality of registration features.

8. The apparatus of claim 7, wherein at least some of the registration features are MEMS features.

9. The apparatus of claim 7, wherein the die sub-carriers have cavities for holding the plurality of singulated semiconductor die, and wherein at least some of the registration features are cavity walls.

10. A method of mating an array of electrical contactors with a plurality of singulated semiconductor die, the method comprising:
placing the plurality of singulated semiconductor die on a die carrier, said die carrier having a plurality of registration features thereon;
mating the plurality of singulated semiconductor die with the array of electrical contactors, said array of electrical contactors having a second plurality of registration features, said second plurality of registration features corresponding to the first plurality of registration features, wherein each electrical contactor includes a substrate and a plurality of electrical contacts extending from the substrate, wherein said electrical contactors are attached to a base substrate individually or in multiple groups by one or more interposers, wherein said one or more interposers provide independent movement of the individual electrical contactors or electrical contactor groups with respect to the base substrate, said mating causing corresponding ones of the first and second pluralities of registration features to register with one another and move independently at least one of the individual electrical contactors or at least one of the electrical contactor groups with respect to the base substrate.

11. The method of claim 10, wherein causing movement of at least one of the individual electrical contactors or electrical contactor groups comprises causing movement in an elastomeric interposer positioned between one of the individual electrical contactors or electrical contactor groups and the base substrate.

12. The method of claim 10, wherein causing movement of at least one of the individual electrical contactors or electrical contactor groups comprises causing movement of a spring interposer that attaches one of the individual electrical contactors or electrical contactor groups to the base substrate.

13. Apparatus for testing a plurality of singulated semiconductor die, comprising:
a die carrier configured to hold one or more of the singulated semiconductor die;
a base substrate; and
an array of electrical contactors for contacting the singulated semiconductor die carried on the die carrier, wherein each electrical contactor includes a substrate and a plurality of electrical contacts extending from the substrate, wherein said electrical contactors are attached to said base substrate individually or in multiple groups by one or more interposers, and wherein said one or more interposers provide independent electronically-controlled or kinematically-controlled movement of the individual electrical contactors or electrical contactor groups with respect to the base substrate.

14. The apparatus of claim 13, said one or more interposers further comprising at least one elastomeric interposer positioned between i) at least one of the individual electrical contactors or electrical contactor groups and ii) the base substrate.

15. The apparatus of claim 13, said one or more interposers further comprising a plurality of motors or actuators positioned between i) ones of the individual electrical contactors or electrical contactor groups and ii) the base substrate, said motors or actuators configured to move the individual electrical contactors or electrical contactor groups with respect to the base substrate.

16. The apparatus of claim 13, wherein the die carrier has a first plurality of registration features thereon, and wherein the array of electrical contactors has a second plurality of registration features, the second plurality of registration features corresponding to the first plurality of registration features.

17. The apparatus of claim 16, wherein the die carrier has cavities for holding the plurality of singulated semiconductor die, and wherein at least some of the registration features are cavity walls.

18. The apparatus of claim 16, further comprising a plurality of die subcarriers carried by the die carrier, wherein the die sub-carriers have cavities for holding the plurality of singulated semiconductor die, and wherein at least some of the registration features are cavity walls.

* * * * *